United States Patent
Arimoto et al.

(10) Patent No.: US 6,781,915 B2
(45) Date of Patent: Aug. 24, 2004

(54) SEMICONDUCTOR MEMORY DEVICE

(75) Inventors: Kazutami Arimoto, Hyogo (JP); Hiroki Shimano, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/274,872

(22) Filed: Oct. 22, 2002

(65) Prior Publication Data

US 2003/0137892 A1 Jul. 24, 2003

(30) Foreign Application Priority Data

Jan. 22, 2002 (JP) ..................... 2002-012999

(51) Int. Cl.⁷ .............................. G11C 8/00
(52) U.S. Cl. ............... 365/230.03; 365/230.06; 365/185.11; 365/185.21; 365/185.23; 365/189.08
(58) Field of Search ............... 365/230.03, 230.06, 365/185.11, 185.21, 189.08, 185.23

(56) References Cited

U.S. PATENT DOCUMENTS

| | | | | |
|---|---|---|---|---|
| 5,701,268 A | * | 12/1997 | Lee et al. | 365/205 |
| 5,936,898 A | * | 8/1999 | Chi | 365/190 |
| 2002/0028550 A1 | | 3/2002 | Morihara et al. | 438/241 |

FOREIGN PATENT DOCUMENTS

JP  2000-124331  4/2000

OTHER PUBLICATIONS

"A Storage–Node–Boosted RAM with Word–Line Delay Compensation" Kazuyasu Fujishima et al., IEEE Journal of Solid–State Circuits, vol. SC–17, No. 5, Oct. 1982, pp. 872–876.

* cited by examiner

*Primary Examiner*—Connie C. Yoha
(74) *Attorney, Agent, or Firm*—McDermott, Will & Emery

(57) ABSTRACT

Memory cells are arranged such that one-bit data is stored by two-bit memory cells. The cell plate electrode of the memory cell capacitor and the gate electrode of the memory cell transistor are formed in the same manufacturing step. The amplitude of an isolation control signal applied to a bit line isolation gate connecting the bit line and the sense amplifier is restricted, and the word line is driven according to a negative voltage non-boosted word line scheme. A well region where a memory block is formed and a well region where the isolation gate is formed are separately provided, and separate bias voltages are applied thereto. Thus, a DRAM (dynamic random access memory)-based logic merged memory is implemented without degrading dielectric breakdown characteristics of the gate insulating film.

11 Claims, 13 Drawing Sheets

F I G. 1 7
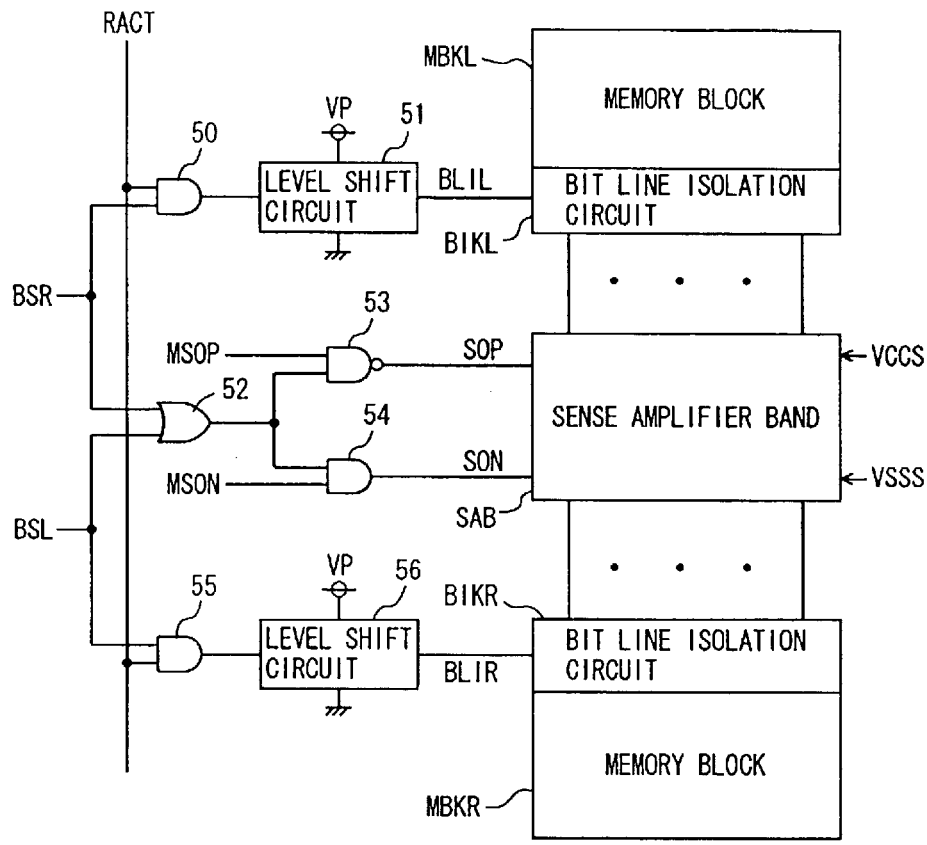
F I G. 1 8
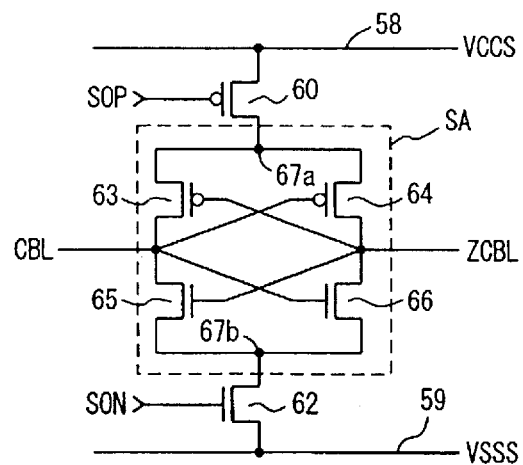

SEMICONDUCTOR MEMORY DEVICE

BACKGROUND OF THE INVENTION

1. Field of the Invention

The present invention relates to semiconductor memory devices, and particularly relates to improvement in data retention characteristics of a semiconductor memory device storing data in a capacitor. More particularly, the present invention relates to a semiconductor memory device, in which data of one bit is stored by memory cells of two bits. More specifically, the present invention relates to a configuration for ensuring reliability of gate insulating films of memory cells in an embedded memory integrated with a logic on the same semiconductor substrate, without impairing the data retention characteristics.

2. Description of the Background Art

In the field of data processing and others, a circuit device called a system LSI (large scale integrated circuit) having a logic such as a processor and a memory device integrated in a common semiconductor chip has been widely used in order to process data at high speed with low power consumption.

In such system LSI, the configuration in which the logic and the memory device are interconnected through on-chip interconnection lines provides the following advantages: (1) due to smaller load of signal interconnection lines than that of the on-board wires, data/signals can be transmitted at high speed; (2) due to no restriction on the number of pin terminals, the number of data bits can be increased, and the band width of data transfer can be widened; (3) due to integration of a plurality of components on a common semiconductor chip, the size of the system can be reduced compared to the configuration where discrete components are arranged on a board, and thus, a small sized, light-weight system is implemented; and (4) macros prepared as a library can be arranged as the components formed on the semiconductor chip, and thus, design efficiency is improved.

By virtue of the advantages described above, the system LSI has been widely used in various fields. DRAM (dynamic random access memory), SRAM (static random access memory), non-volatile semiconductor memory device and other memory devices have been used for the memory device to be integrated. For the logic to be merged, a processor performing control and processing, an analog processing circuit such as an A/D converter, a logic circuit performing a specialized logical operation and others have been employed.

When integrating a processor and a memory device in the LSI system, it is desired to form the logic and the memory device in the same manufacturing steps as many as possible for the purposes of reducing the number of manufacturing steps and cost. A DRAM stores data in a capacitor in the form of charges. This capacitor has electrodes called a storage node electrode and a cell plate electrode formed above a semiconductor substrate region. Such a memory capacitor is generally called a stacked capacitor, and has a complicated shape like a hollow cylinder to achieve a large capacitance value with a small occupying area.

Thus, in the DRAM-logic hybrid process of forming the DRAM and the logic in the same manufacturing process, even if the transistor of the logic and the transistor of the DRAM are formed in the same manufacturing process, additional manufacturing steps of forming the capacitor of the DRAM, and a planarization process for alleviating unevenness or steps between the DRAM and the logic and between the DRAM memory array and the peripheral portion, due to the three dimensional structure of the capacitor of the DRAM, become necessary. This significantly increases the number of manufacturing steps and also increases the chip cost.

In an SRAM, a memory cell is formed of four transistors and two load elements. Normally, the load elements are formed with MOS transistors (insulated gate type field effect transistors), and capacitors or the like are not used. Accordingly, an SRAM can be formed by a full CMOS logic process, and hence, the SRAM and the logic can be formed in the same manufacturing process.

The SRAM, due to its high speed operability, is conventionally used as a cache memory for a processor, a register file memory or the like.

Further, the SRAM has a memory cell formed of a flip-flop circuit, and data is retained as long as a power supply voltage is supplied. Thus, unlike the DRAM, the SRAM does not require refreshing for retention of data, and complicated memory control associated with the refreshing, indispensable to the DRAM, is unnecessary for the SRAM. Thus, the SRAM, simpler in control than the DRAM, has been widely used as a main memory of a portable information terminal or the like, to simplify the system configuration.

However, a portable information terminal now requires a memory of even larger storage capacity, as it is required to handle a large amount of data such as audio and image data, as its recent progress in functionality.

In the DRAM, the memory cell is shrunk along with the progress of a miniaturization process. For example, a cell size of 0.3 $\mu m^2$ has been implemented according to the 0.18 $\mu m$ DRAM process. In contrast, in the SRAM, a full CMOS memory cell consists of six MOS transistors in total with two P channel MOS transistors and four N channel MOS transistors. Therefore, even if the miniaturization process advances, it is necessary to isolate an N well for forming P channel MOS transistors from a P well for forming N channel MOS transistors in a memory cell. The constraints of such an inter-well isolation distance hinder shrinkage of the memory size of the SRAM, compared to the DRAM. For example, in the 0.18 $\mu m$ CMOS logic process, the memory size of the SRAM is 7 $\mu m^2$ or so, which is more than 20 times the memory size of the DRAM. Accordingly, if the SRAM is utilized as a main memory of large storage capacity, the chip size will significantly increase. It would be extremely difficult to merge an SRAM of storage capacity of 4 Mbits or more with a logic within a system LSI of limited chip area.

In view of the foregoing consideration, it can be considered to use a DRAM-based memory for the large capacity embedded memory. Such a DRAM-based embedded memory could be manufactured employing conventional manufacturing processes to some extent, using conventional manufacturing apparatus and steps. With this DRAM-based memory, however, there still arises the above-described problem of step of the capacitor as long as data is stored in the capacitor. It would be impossible to form the DRAM-based memory and the logic through the same manufacturing steps.

In addition, portable terminal equipment is battery-powered, and it is required to reduce current consumption to the greatest possible extent from the standpoint of life time of the battery. Refresh in the data holding mode is performed simply for retention of data. If the current consumption required for this refresh could be reduced, a stand-by current will be reduced, and correspondingly, the life time of battery will increase.

A possible way to reduce current consumption in such refresh may be to decrease the number of times of refreshing, or to lengthen refresh intervals. If data retention characteristics of a memory cell can be improved and data holding time can be lengthened, the refresh interval will be lengthened, and accordingly, the current consumption required for the refresh could be reduced.

As a way of improving the data retention characteristics of the DRAM, a word line driving scheme called a boosted word line scheme has been used conventionally, wherein a selected word line is driven to a voltage level higher than a power supply voltage level in order to transmit data of a full VCC level to memory cells. In this boosted word line scheme, bit lines are driven by a sense amplifier to a power supply voltage level and a ground voltage level upon completion of a sensing operation. Thus, a high voltage corresponding to a difference between the voltage on the selected word line and the ground voltage will be applied between the gate and source of the transistor of a selected memory cell. If such a high voltage is applied between the gate and source of a memory cell transistor, the gate insulating film of the miniaturized transistor will suffer dielectric breakdown.

Particularly in an embedded memory integrated with a logic on the same semiconductor substrate, it is necessary to consider to form the logic transistor and the memory cell transistor in the same manufacturing process. In order to ensure high-speed operability of the logic transistor, the film thickness of the gate insulating film of the logic transistor is made thin. Thus, especially in such a case, dielectric breakdown characteristics of the memory cell transistor will not be ensured.

Another way of improving the data retention characteristics of a memory cell is a word line driving scheme called a negative voltage word line driving scheme, wherein for a memory cell transistor formed of an N channel MOS transistor, a non-selected word line is maintained at a negative voltage level.

In a stand-by state, the memory cell transistor receives a negative voltage at its gate, and a bit line is maintained at an intermediate voltage level, so that a leakage current through the memory cell transistor is suppressed. Accordingly, the data retention characteristics in the stand-by state, or pause refresh characteristics, is improved by this negative voltage word line driving scheme.

When memory cell data is read out according to a selected word line, the bit line voltage is driven to a power supply voltage level or a ground voltage level and latched by a sense amplifier. In this state, out of the memory cells connected to a non-selected word line, or non-selected memory cells, the memory cell connected to a bit line of a ground voltage level has a transistor having a gate receiving a negative voltage, a source attaining a ground voltage level. Thus, the gate to source of such non-selected memory cell attains a reverse-biased state, to prevent the flow of the leakage current from the storage node storing H (logical high) level to the bit line, resulting in increased data retention time of H level data. The operation affecting the charges stored in a non-selected memory cell at the time of memory cell selection is generally called "disturb".

In the case of the negative voltage word line driving scheme, the gate to source of a non-selected memory cell transistor is maintained in a reverse-biased state, so that the disturb refresh characteristics is improved. In a non-selected memory cell connected to a bit line at a power supply voltage level, however, a high voltage is applied to its gate insulating film, resulting in degradation of reliability of the gate insulating film, as in the case of the boosted word line scheme described above. Particularly, in data access, duty of a non-selected state of a memory cell is greater than that of a selected state. Thus, in this negative voltage word line driving scheme for suppressing the disturb, the problem of reliability of the gate insulating film becomes more serious.

SUMMARY OF THE INVENTION

An object of the present invention is to provide a semiconductor memory device having large storage capacity with a small occupying area, without increasing the number of manufacturing steps.

Another object of the present invention is to provide a semiconductor memory device improved in data retention characteristics without degradation of dielectric breakdown voltage characteristics of memory transistors.

A further object of the present invention is to provide an embedded memory excellent in data retention characteristics and dielectric breakdown voltage characteristics, which can be manufactured in the same manufacturing steps as those for a logic.

The semiconductor memory device according to the present invention includes a plurality of memory sub-blocks each having a plurality of memory cells arranged in rows and columns. The memory sub-block includes a plurality of word lines arranged corresponding to the respective rows and each having memory cells in the corresponding row connected thereto, and a plurality of bit lines arranged corresponding to the respective columns and each having memory cells in the corresponding column connected thereto.

The semiconductor memory device according to the present invention further includes a plurality of sense amplifier bands provided corresponding to the plurality of memory sub-blocks and shared between the adjacent memory sub-blocks. Each sense amplifier band includes a plurality of sense amplifiers provided corresponding to the columns in the corresponding memory sub-blocks and senses and amplifies memory cell data in the corresponding columns when activated. Each sense amplifier receives a first power supply voltage and a second power supply voltage different in a logical level the first power supply voltage as its operating power supply voltages, and performs a sensing operation.

The semiconductor memory device according to the present invention further includes a plurality of bit line isolation circuits arranged corresponding to the sense amplifier bands and the memory sub-blocks. Each bit line isolation circuit includes a plurality of isolation gates each arranged corresponding to the column in the corresponding memory sub-block and connects the sense amplifiers on the corresponding columns to the corresponding bit lines in the corresponding memory sub-block when rendered conductive. Each of the plurality of bit line isolation circuits is formed in a well region different from well regions for the plurality of memory sub-blocks. Each isolation gate is formed of an insulated gate type field effect transistor.

The semiconductor memory device according to the present invention further includes a bit line isolation control circuit which generates an isolation control signal of the first power supply voltage level to a bit line isolation circuit arranged for a selected memory sub-block including a selected memory cell addressed according to a first address signal, and generates a non-selected isolation control signal of a voltage level not smaller in absolute value than the second power supply voltage to a bit line isolation circuit arranged for a memory sub-block sharing the sense amplifiers with the selected memory sub-block.

The semiconductor memory device according to the present invention further includes a word line selection circuit which drives a selected word line on an addressed row in the selected memory sub-block according to a second address signal to the first power supply voltage level, and transmits a voltage higher in absolute value than the second power supply voltage to the word lines other than the selected word line.

By setting the voltage of the bit line isolation gate to the first voltage level of the sense power supply voltage and by connecting the sense amplifier and the bit line, data of the first power supply voltage level latched by the sense amplifier is transmitted to the bit line with threshold voltage loss of the bit line isolation gate caused. Accordingly, the gate to source/drain voltage of the non-selected memory cell transistor can be alleviated by the threshold voltage, so that the dielectric breakdown voltage characteristics of the memory cell transistor is ensured.

Since the selected word line is merely driven to the sense power supply voltage level, the voltage applied between the gate and the source/drain of the selected memory cell transistor can be alleviated. The pause refresh characteristics and the disturb refresh characteristics are both improved, so that the data retention characteristics is improved.

By forming separate well regions for the bit line isolation gates and for the memory cells, it is possible to optimize the well bias of the bit line isolation gate to set the threshold voltage loss as desired. Accordingly, the voltage applied across the gate insulating film of the memory cell transistor can be optimized.

The logic transistor can be utilized as the memory cell transistor, which suppresses an increase of the number of the manufacturing steps.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 17 schematically shows a configuration of the control signal generating circuit in the semiconductor memory device according to the first embodiment.

FIG. 18 shows a configuration of a sense amplifier included in the sense amplifier band shown in FIG. 17.

DESCRIPTION OF THE PREFERRED EMBODIMENTS

[First Embodiment]

Figure 1:
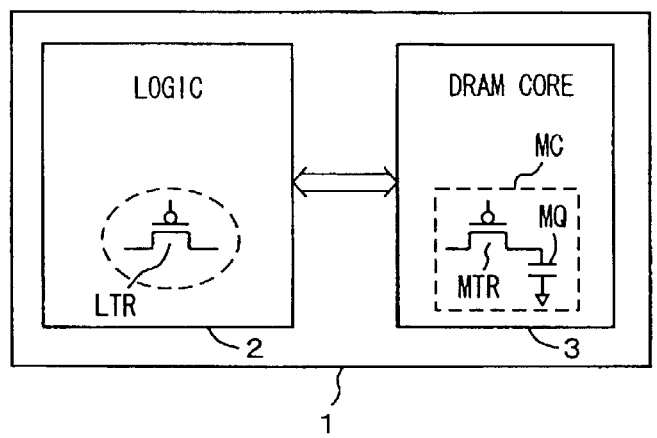
FIG. 1 schematically shows an entire construction of a semiconductor integrated circuit device including a semiconductor memory device according to a first embodiment of the present invention.

FIG. 1 schematically shows a construction of a semiconductor integrated circuit including the semiconductor memory device according to the first embodiment of the present invention.

Referring to FIG. 1, the semiconductor integrated circuit device 1 includes a logic 2 performing a predetermined logical operation and a DRAM core 3 storing data required by logic 2. DRAM core 3 is a DRAM-based memory formed with a DRAM being a base. Logic 2 also has a memory control function of controlling an access to DRAM core 3.

Logic 2 includes a logic transistor LTR as its component. This logic transistor LTR is formed of an insulated gate type field effect transistor, and is a low Vth transistor having its gate insulating film made sufficiently thin to ensure its high speed operability, and having a threshold voltage Vth of a small absolute value.

In FIG. 1, a P channel MOS transistor is shown as a representative of the logic transistor LTR. However, logic 2 is manufactured through CMOS processing, and also includes an N channel MOS transistor as its component.

DRAM core 3 includes a memory cell MC for storing data. This memory cell MC includes a memory capacitor MQ for storing information and an access transistor MTR for reading out the information stored in memory capacitor MQ. In the first embodiment, the transistor MTR included in memory cell MC is formed of a P channel MOS transistor. This memory transistor MTR is formed in the same manufacturing step as that of the logic transistor LTR. Similarly, a cell plate electrode of the memory capacitor MQ is formed in the same manufacturing step as that of a gate electrode of the logic transistor, as will be described later in detail.

DRAM core 3 includes a transistor of a peripheral circuit (not shown), which is also formed in the same manufacturing step as that of the logic transistor LTR. Thus, by forming the cell plate electrode of memory capacitor MQ in the same manufacturing step as that of the gate electrodes of logic transistor LTR and memory transistor MTR, a process for reducing the step at the memory capacitor MQ to planarize the capacitor portion, is simplified or even becomes unnecessary. Accordingly, it is possible to form logic 2 and DRAM core 3 in the same manufacturing process.

Figure 2:
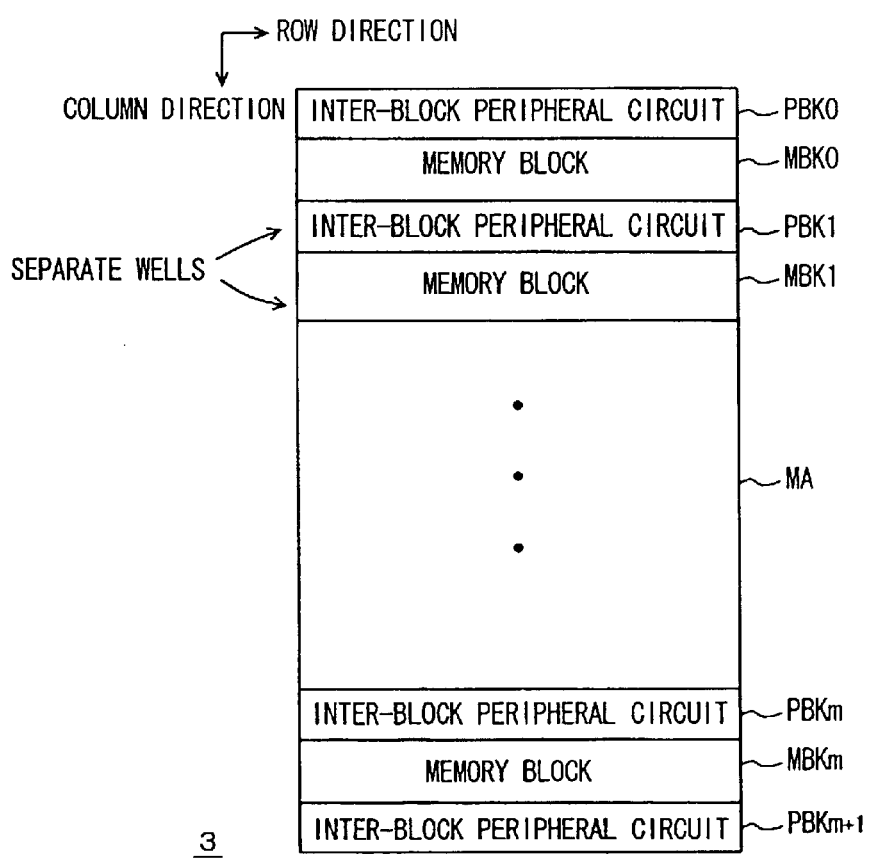
FIG. 2 schematically shows a construction of an array portion of the semiconductor memory device according to the first embodiment.

FIG. 2 schematically shows a construction of a memory array portion of the DRAM core in FIG. 1. Referring to FIG. 2, the memory array MA is divided into a plurality of memory blocks MBK0–MBKm along a column direction. In each of memory blocks MBK0–MBKm, memory cells are arranged in rows and columns.

Inter-block peripheral circuits PBK1–PBKm are arranged in respective regions between adjacent two memory blocks of the memory blocks MBK0–MBKm. Inter-block peripheral circuits PBK0 and PBKm+1 are arranged outside the memory blocks MBK0 and MBKm, respectively. Inter-block peripheral circuits PBK0–PBKm+1 each include sense amplifiers for sensing and amplifying memory cell data, a bit line isolation circuit for connecting a memory block to sense amplifiers, a column select circuit for connecting a selected sense amplifier to an internal data bus, and others.

Well regions for formation of memory cells included in respective memory blocks MBK0–MBKm are provided separately from well regions for formation of components included in inter-block peripheral circuits PBK0–PBKm. Particularly, the well regions for forming the bit line isolation circuits included in inter-block peripheral circuits PBK0–PBKm+1 are formed separately from the well regions for forming the memory cells included in memory blocks MBK0–MBKm.

When an isolation gate included in the bit line isolation circuit is formed of a MOS transistor, its threshold voltage is adjusted to adjust the voltage amplitude of a bit line for alleviating a voltage applied across a gate of a memory cell transistor. Thus, memory transistor MTR is formed in the same manufacturing step as logic transistor LTR and, even if the gate insulating film is made thin, the dielectric breakdown voltage characteristics of the memory cell transistor is ensured.

Figure 3:
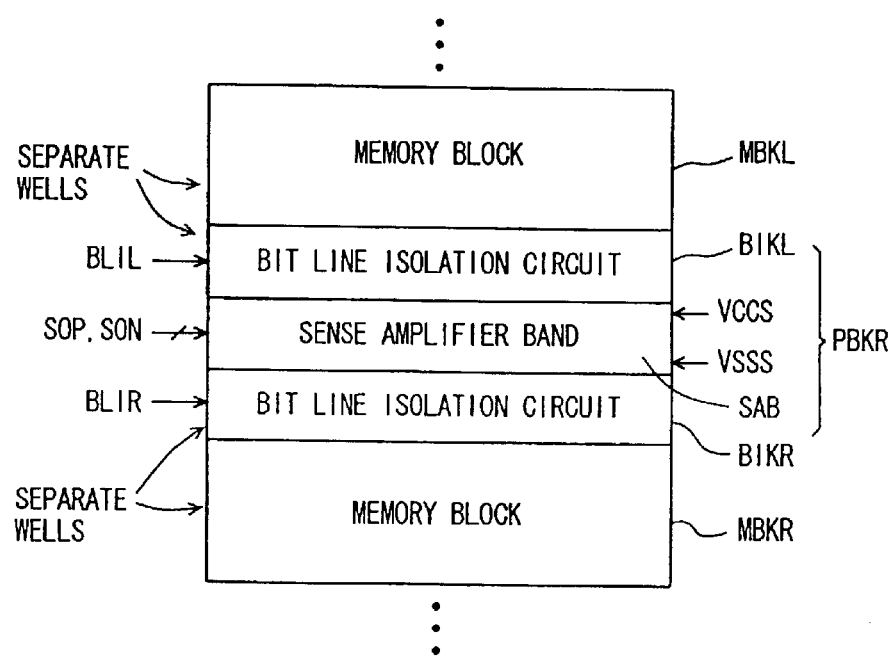
FIG. 3 shows a specific construction of the inter-block peripheral circuit shown in FIG. 2.

FIG. 3 schematically shows a construction of the inter-block peripheral circuit. In FIG. 3, the construction of inter-block peripheral circuit PBKR that is arranged between memory blocks MBKL and MBKR is schematically shown.

Referring to FIG. 3, inter-block peripheral circuit PBKR includes: a sense amplifier band SAB which includes sense amplifiers each placed to a column of a corresponding memory block and activated according to sense amplifier activating signals SOP and SON for driving and latching memory cell data of the corresponding column to a sense power supply voltage (high level power supply voltage) VCCS level and a sense ground voltage (low voltage power supply voltage) VSSS level; a bit line isolation circuit BIKL which connects sense amplifier band SAB to the columns of memory block MBKL according to a bit line isolation instructing signal BLIL; and a bit line isolation circuit BIKR which selectively connects sense amplifier band SAB to memory block MBKR according to a bit line isolation instructing signal BLIR.

When a selected row is included in one of memory blocks MBKL and MBKR, the bit line isolation instructing signal for the memory block including the selected row (i.e., selected memory block) has the same state as a stand-by state, and the bit line isolation circuit for the other memory block (i.e., non-selected memory block) is isolated from sense amplifier band SAB.

Bit line isolation instructing signals BLIL and BLIR have the same amplitude as a word line driving signal that is transmitted to word lines included in memory blocks MBKL and MBKR, as will be described later in detail.

The well region for formation of bit line isolation circuit BIKL is formed separately from the well region of the memory cell formation region of memory block MBKL. The well region for formation of bit line isolation circuit BIKR is formed in a region other than the well region for formation of memory block MBKR.

A word line is driven in non-boosted word line scheme. That is, a word line driving signal of a ground voltage level is transmitted to a selected word line, while a voltage higher than sense power supply voltage VCCS is transmitted to a non-selected word line. Thus, for bit line isolation instructing signals BLIL and BLIR, when the corresponding bit line isolation circuit is conductive, its voltage level is also at a non-boosted voltage level.

Data of a VCCS/VSSS level latched by a sense amplifier in sense amplifier band SAB suffers threshold voltage loss across an isolation gate of the bit line isolation circuit upon transmission to a bit line of a selected memory block. Specifically, the bit line of the selected memory block receives a voltage of Vthp as an L level signal. Here, Vthp is an absolute value of the threshold voltage of the P channel MOS transistor constituting the bit line isolation gate. Thus, upon selection of a memory cell, a voltage applied across the gate insulating film of a memory cell connected to a non-selected word line (i.e., non-selected memory cell) is alleviated.

Figure 4:
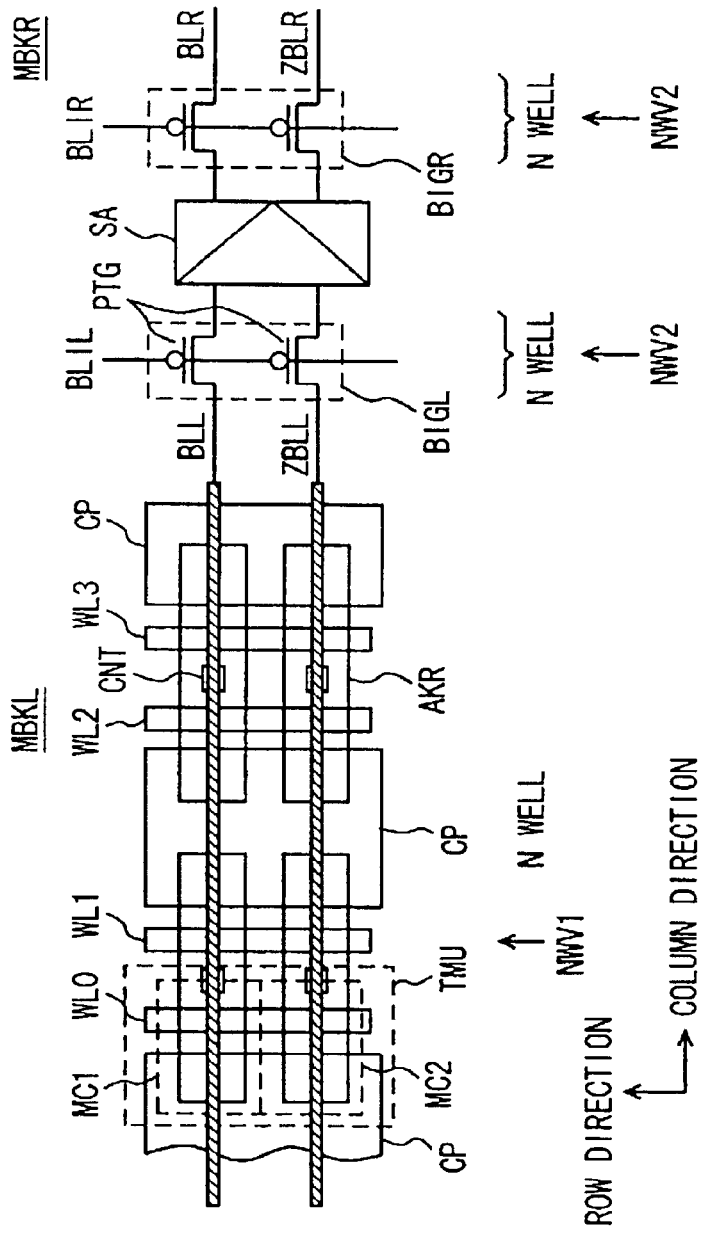
FIG. 4 shows a detailed configuration of the memory block and the inter-block peripheral circuit shown in FIG. 3.

FIG. 4 shows arrangement of memory cells in memory block MBKL shown in FIG. 3 and also shows a configuration of an associated inter-block peripheral circuit. In FIG. 4, layout of memory cells arranged in four rows and two columns in memory block MBKL is shown representatively.

Referring to FIG. 4, memory block MBKL is provided with word lines WL0–WL3 extending in a row direction. Cell plate electrode lines CP are formed in parallel with word lines WL0–WL3 in the same interconnection layer. In memory block MBKL, a cell plate electrode line CP is provided for each two word lines, extending in the row direction, and two cell plate electrodes CP adjacent in a column direction are isolated from each other by two word lines provided therebetween. Cell plate electrode line CP is commonly arranged for memory cells of two rows.

Active regions AKR for formation of memory cells are arranged aligned in row and column directions. Active region AKR has a rectangular shape longer in the column direction. In each active region AKR, memory cells of two bits adjacent to each other in the column direction are formed.

Bit lines BLL and ZBLL are provided in parallel with the active regions aligned in the column direction. These bit lines BLL and ZBLL are connected to active regions AKR via bit line contacts CNT. Bit line contact CNT is provided between adjacent two word lines, and shared by the memory cells of two bits formed in the relevant active region.

Active region AKR includes a P type impurity region formed in an N well. The memory cell transistor is formed of a P channel MOS transistor. Cell plate electrode line CP is supplied with a constant reference voltage (cell plate voltage) of a ground voltage or negative voltage level. A memory cell capacitor is formed at the crossing of the cell plate electrode line CP and active region AKR.

Bit line contact CNT is formed between two word lines WL adjacent in the column direction. Memory cells of two bits adjacent to each other in the row direction store data of one bit. This set of memory cells (MC1, MC2) storing 1-bit data is hereinafter called a twin cell unit TMU.

Bit lines BLL and ZBLL are arranged at a pitch (arrangement interval) of memory cells in the row direction. Thus, the pitch condition of the bit lines can be relaxed. This memory cell arrangement is "most closely packed arrangement", which is used for an open bit line configuration. However, since data of one bit is stored by twin cell unit TMU and complementary data are read out to bit lines BLL and ZBLL, a folded bit line configuration excellent in noise immunity can be utilized, enabling accurate data reading.

Bit lines BLL and ZBLL are coupled to a sense amplifier SA via a bit line isolation gate BIGL. Bit lines BLR and ZBLR of memory block MBKR are coupled to sense amplifier SA via a bit line isolation gate BIGR.

Bit line isolation gate BIGL is included in bit line isolation circuit BIKL shown in FIG. 3. Bit line isolation gate BIGR is included in bit line isolation circuit BIKR shown in FIG. 3. Sense Amplifier SA is included in sense amplifier band SAB shown in FIG. 3.

These bit line isolation gates BIGL and BIGR each include transfer gates PTG formed of P channel MOS transistors. Bit line isolation gates BIGL and BIGR are each formed in an N well region, to which a well bias voltage NWV2 is applied. To an N well region for forming memory cells, a well bias voltage NWV1 is applied.

Bit lines BLL and ZBLL are arranged in pairs, and one sense amplifier SA is provided for a bit line pair. Bit lines are arranged such that one bit line is placed per pitch of memory cells in the row direction, and adjacent two bit lines constitute a bit line pair. Thus, the pitch condition of sense amplifier SA in a row direction can be relaxed, and sense amplifier SA can be arranged with a sufficient margin.

It is unnecessary to provide sense amplifiers alternately at both sides of memory blocks as commonly done in a conventional DRAM. Instead, sense amplifiers can be placed corresponding to respective bit line pairs in one sense amplifier band, to halve the number of sense amplifier bands.

Upon selection of memory cells, one word line is driven to a selected state. When word line WL0, for example, is driven to a selected state, data stored in memory cells MC1 and MC2 are transmitted to bit lines BLL and ZBLL. With complementary data stored in these memory cells MC1 and MC2, even if the amounts of accumulated charges in the memory cell capacitors are small, a sufficiently large voltage difference can be generated between bit lines BLL and ZBLL, so that the data retention characteristics can be improved.

Figure 5:
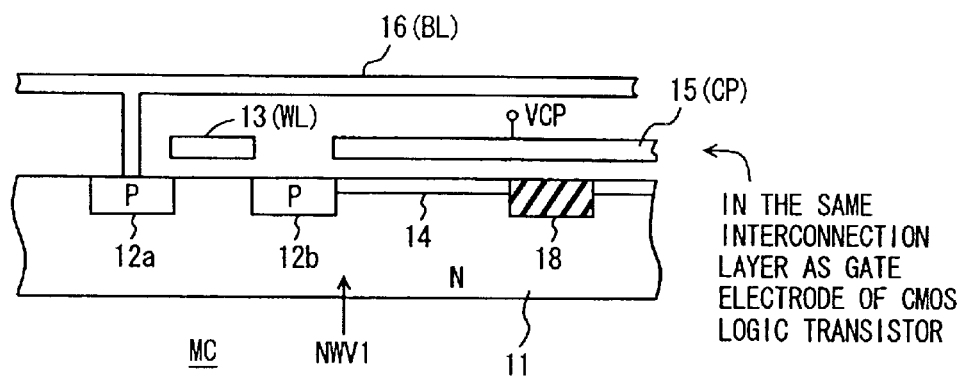
FIG. 5 schematically shows a cross sectional structure of the memory cell shown in FIG. 4.

FIG. 5 schematically shows a cross sectional structure of memory cell MC (MC1, MC2) shown in FIG. 4. Referring to FIG. 5, memory cell MC includes: impurity regions 12a and 12b formed, in a surface of an N type well region 11, spaced apart from each other; a conductive layer 13 formed above a surface of a region between impurity regions 12a and 12b with a gate insulating film (not shown) interposed in between; a storage node region 14 electrically coupled to impurity region 12b; a conductive layer 15 placed facing to storage node region 14; and a conductive layer 16 electrically connected to impurity region 12a.

A cell isolation region 18 formed of, e.g., a field insulating film is formed adjacent to storage node region 14.

Conductive layers 13, 15 and 16 constitute word line WL, cell plate electrode line CP and bit line BL, respectively. Conductive layer 15 constituting the cell plate electrode line is arranged facing to a storage node region of an adjacent memory cell via cell isolation region 18.

Storage node region 14 may simply be an inversion layer formed in the surface of N well region (semiconductor substrate region) 11, or may be an impurity region doped with impurities, with an inversion layer formed in a surface thereof To form the inversion layer in storage node region 14, cell plate voltage VCP applied to conductive layer 15 is set to a ground voltage or negative bias voltage level.

In order to minimize a step in the DRAM portion, a cell isolation film formed in cell isolation region 18 is subjected to CMP (chemical mechanical polishing), for example, for planarization of the surface of the cell isolation film, and the surface of cell isolation region 18 is made substantially the same with the surface of N well 11.

Conductive layers 13 and 15 are formed in the same interconnection layer using a material including silicon, such as doped polysilicon, polycide like tungsten silicide (WSix) and cobalt silicide (CoSix), and salicide (self-aligned silicide).

These conductive layers 13 and 15 are formed in the same interconnection layer as the gate electrodes of the transistors in the CMOS logic process (i.e., transistor of the logic and transistor of the peripheral circuit of the DRAM core). Here, "formation in the same interconnection layer" means "the manufacturing in the same manufacturing process step" (the same in composition and others).

Although not clearly shown, a gate insulating film and a capacitor insulating film are formed just beneath conductive layers 13 and 15, respectively. These gate insulating film and capacitor insulating film may be the same insulating film (with the same composition and the same film thickness) formed in the same manufacturing process. Alternatively, they may be formed as oxide films with different film thicknesses (with the same composition) through a dual gate oxide film process. Here, the "dual gate oxide film process" is a process in which an oxide film (insulating film) is selectively etched to form oxide films (insulating films) of two kinds of film thicknesses.

The insulating films formed beneath conductive layers 13 and 15 may have film thicknesses different from that of the gate insulating film of the logic transistor.

Conductive layer 16 constituting bit line BL is formed of a first metal interconnection layer, for example, above conductive layer 15 serving as cell plate electrode line CP, so that a so-called CUB (capacitor under bit line) structure is achieved.

The capacitor of the memory cell has a planar type capacitor structure with a storage node electrode formed of a storage node electrode layer 14 that is made by a diffusion layer or an inversion layer in the surface of N well 11 and a cell plate electrode extending in a row direction in parallel with a word line. Since cell plate electrode line CP and word line WL are formed in the same interconnection layer in the same manufacturing process step, it is unnecessary to further add an interconnection layer for the cell plate electrode and for the storage node electrode. This simplifies the manufacturing process.

Since the memory cell capacitor has the planar type capacitor structure, there occurs no step between the memory array portion and the peripheral circuit portion, eliminating the need for a planarization process such as CMP for step relaxation. Accordingly, the memory array can essentially be formed through the CMOS logic process, in the same manufacturing steps as those of the logic transistors. Cell isolation region 18 is formed prior to fabrication of memory cell transistors, for the purpose of delimiting active regions.

The memory cell transistor and the memory capacitor of the memory cell are each formed of a PMOS transistor, and has a threshold voltage set substantially at the same value as that of the logic transistor. In particular, the memory cell transistor (MTR) can have the driving capability substantially at the same level as that of the logic transistor (LTR), so that high speed reading/writing on the memory cell is achieved.

The planar type capacitor structure may not provide sufficient capacitor capacitance. However, the memory cells are selected in a 1-bit/2-cell mode where 1-bit data is stored by two memory cells, the memory cell capacitor capacitance can be increased equivalently, and the such insufficient capacitance of memory capacitor could be compensated for. In other words, as complementary data are regularly read out to complementary bit lines, the voltage difference between the bit lines is doubled, and thus, adequate data retention characteristics is ensured.

Specifically, the potentials V(SN, H) and V(SN, L) of the storage node (storage node region 14) of memory cell MC storing H level data and L level data, respectively, are approximately expressed as follows:

$$V(SN, H) \approx VCCS \cdot \exp(-T/\tau a), \text{ and}$$

$$V(SN, L) \approx VWV1 \cdot (1-\exp(-T/\tau b)),$$

where coefficients $\tau a$ and $\tau b$ are time constants determined by a leakage current between the storage node and cell pate electrode, a leakage current between the storage node and substrate region (well region), an off-leakage current of the memory cell transistor, and others.

A read potential difference $\Delta Vb1$ of a bit line pair when data stored in memory cells are read out to the bit line pair in a 1-bit/2-cell mode (twin cell mode) where 1-bit data is stored by two memory cells (DRAM cells) is expressed as follows:

$$\Delta Vb1 = Cs \cdot (V(SN, H) - V(SN, L))/(Cs+Cb),$$

where Cs represents capacitance of memory cell capacitor MQ, and Cb represents parasitic capacitance of each of bit lines BL and ZBL.

Accordingly, compared to the case where storage data of one memory cell is read out to a bit line and the other bit line is maintained at a precharge voltage level of an intermediate voltage level, the read potential difference $\Delta Vb1$ between the bit lines can substantially be doubled. Thus, an adequately large read potential difference is obtained despite small capacitance Cs of the memory cell capacitor. Accordingly, adequate data retention characteristics is ensured even if adequate capacitor capacitance cannot be secured due to the planar type capacitor structure.

Figure 6:
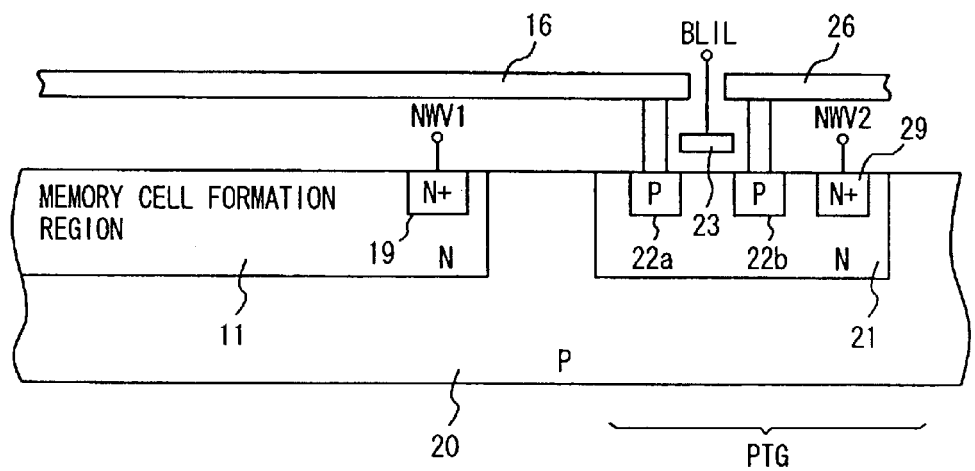
FIG. 6 schematically shows a cross sectional structure of a transistor in the bit line isolation gate shown in FIG. 4.

FIG. 6 schematically shows a cross sectional structure of a transfer gate PTG included in the bit line isolation gate shown in FIG. 4. Referring to FIG. 6, transfer gate PTG is formed in an N well region 21 that is provided separately from N well region 11 where memory cells are formed. Transfer gate PTG includes P type impurity regions 22a and 22b formed, in the surface of N well region 21, spaced apart from each other, and a gate electrode 23 formed above the surface of N well region 21 between impurity regions 22a and 22b with a gate insulating film (not shown) interposed in between.

Figure 7:
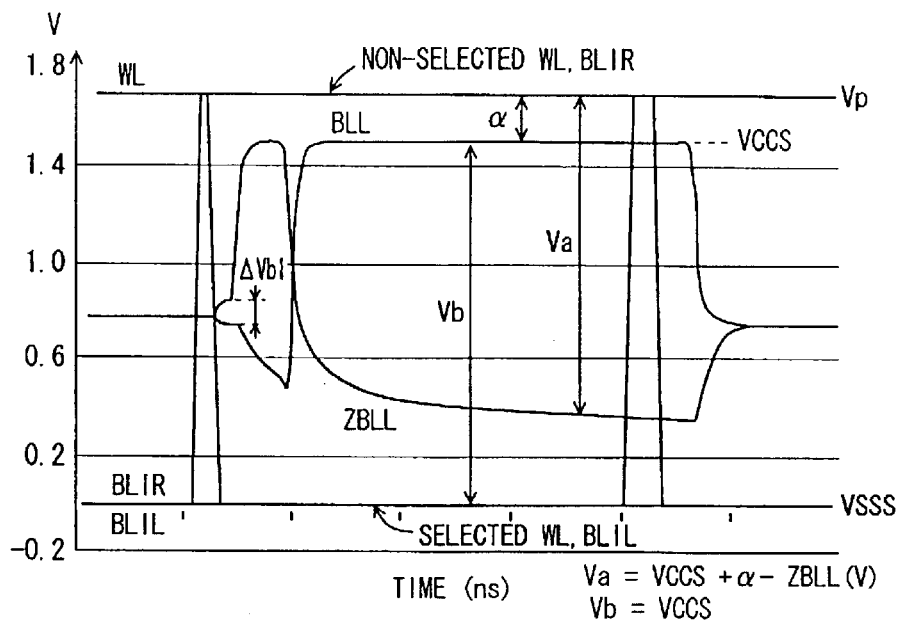
FIG. 7 shows signal waveforms representing an operation of the semiconductor memory device of the first embodiment in data writing.

A well bias voltage NWV1 is applied to N well region 11 where the memory cells are formed, via an N type impurity region 19. To N well region 21, a well bias voltage NWV2 is applied via an N type impurity region 29. Impurity region 22b is connected to a conductive layer 26 that is formed in the same step as that of conductive layer 16 constituting bit line BL. Conductive layer 26 constitutes a common bit line shared between the memory blocks, and is connected to a sense amplifier. Now, the operation of the semiconductor memory device shown in FIG. 4 will be described with reference to signal waveform diagram shown in FIG. 7. FIG. 7 shows the signal waveforms in data writing.

In a stand-by state, bit line isolation instructing signals BLIR and BLIL are both at a ground voltage level, and word line WL is at a high voltage VP level. Bit line isolation gates BIGL and BIGR are both in a conductive state, and sense amplifier SA is connected to bit lines BLL, ZBLL, BLR and ZBLR. Due to word line WL being at the high voltage VP level, the memory cell transistor formed of a P channel MOS transistor is in a non-conductive state.

Bit lines BLL, ZBLL, BLR and ZBLR are precharged and equalized to a voltage level of an intermediate voltage (VCCS/2) by precharge/equalize circuits (not shown).

The precharge/equalize operation of the bit lines is completed before a memory cycle for memory cell selection is started. When an address signal is supplied, a memory block is designated in accordance with a block address signal included in the address signal. A word line WL is selected in the designated memory block in accordance with a word line address included in the address signal.

When a selected memory block is designated, the selected memory block is connected to a corresponding sense amplifier band, and a non-selected memory block is isolated from the sense amplifier band. FIG. 7 shows the operation in the case when a word line in memory block MBKL is selected. In this case, bit line isolation instructing signal BLIR rises from the ground voltage level to a high voltage VP level, while bit line isolation instructing signal BLIL maintains the ground voltage level. Thus, bit line isolation gate BIGR shown in FIG. 4 is rendered non-conductive, and sense amplifier SA is isolated from bit lines BLR and ZBLR.

Then, word line WL corresponding to the addressed row is selected, and the voltage level of the selected word line WL is fallen from the high voltage VP level to a ground voltage VSSS level. Responsively, the access transistors in the memory cells are rendered conductive, and the memory cell capacitors are electrically connected to the corresponding bit lines. Since the memory cells are selected in the twin cell mode at this time, the data stored in the memory cells are transmitted to both bit lines BLL and ZBLL, as shown in FIG. 4.

The voltage level of one of bit lines BLL and ZBLL decreases according to the L level data, and the voltage level of the other bit line increases according to the H level data. When the voltage difference ΔVb1 between these bit lines BLL and ZBLL becomes sufficiently large, sense amplifier SA is activated, and sense nodes (common bit lines) of sense amplifier SA are driven to a sense power supply voltage VCCS level and a sense ground voltage VSSS level, according to the storage data.

In bit line isolation gate BIGL, bit line isolation instructing signal BLIL is at a ground voltage level. Thus, transfer gate PTG transferring H level data can transmit sense power supply voltage VCCS to a corresponding bit line. Transfer gate PTG transferring L level data has its gate set at a ground voltage level. Therefore, the bit line voltage at the L level can not be discharged to the ground voltage level, due to the effect of the threshold voltage of this transfer gate PTG, and becomes a voltage level higher than the ground voltage level.

Thereafter, column selection is performed and write data is transmitted to bit lines BLL and ZBLL. FIG. 7 shows a state where H level data is written onto bit line BLL and L level data onto bit line ZBLL.

When the data writing is completed, the selected word line WL transitions to a non-selected state, and rises in voltage level to a high voltage VP level. Bit line isolation gate BIGR has a gate voltage fallen to a ground voltage VSSS level in accordance with bit line isolation instructing signal BLIR. Thus, bit lines BLL and ZBLL, and bit lines BLR and ZBLR are precharged and equalized to the intermediate voltage level by the precharge/equalize circuits (not shown).

By using the P channel MOS transistor as the bit line isolation gate to make the voltage of the L level bit line higher than the ground voltage, and by maintaining the voltage level of non-selected word line WL at a high voltage VP level higher than sense power supply voltage VCCS, the following advantageous effects are obtained.

Pause Refresh Characteristics

Figure 8:
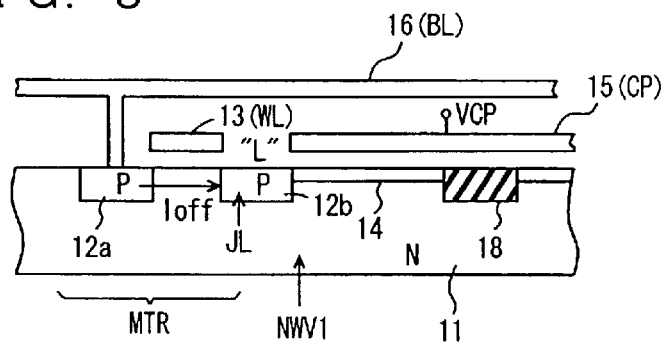
FIG. 8 schematically shows a leakage current flowing path of a memory cell storing L level data in the semiconductor memory device of the first embodiment.

FIG. 8 shows a flowing path of a leakage current in the case when L level data is stored in a storage node. The voltage level of the storage node storing the L level data increases because of a leakage current Ioff flowing from the bit line via impurity region 12a and a junction leakage current JL from N well region 11. Cell plate voltage VCP is at the ground voltage or a negative voltage level. In a stand-by state, word line WL is maintained at a high voltage VP level, and the gate of memory transistor MTR is biased to a positive level with respect to the source region. Thus, memory transistor MTR is in a deep off state, and the leakage current Ioff flowing from the bit line to the storage node is substantially negligible. Junction leakage current JL is a backward leakage current of the PN junction, and can be reduced by decreasing the junction area of impurity region 12b, or by making well bias voltage NWV1 shallow.

The L level data is at a voltage level higher than the ground voltage level. Thus, junction leakage current JL is decreased compared to the case where the L level data is at the ground voltage level.

Figure 9:
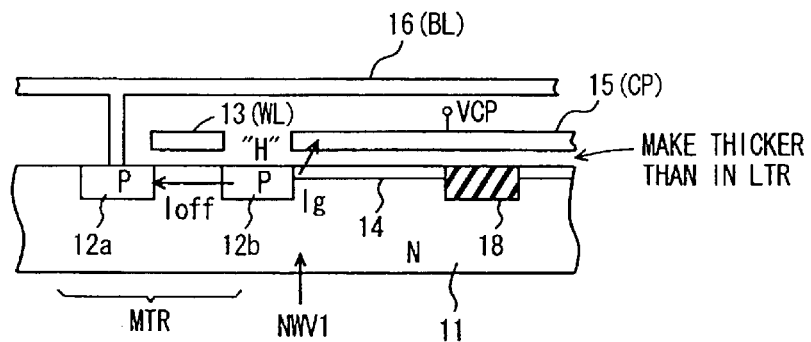
FIG. 9 schematically shows a leakage current flowing path of a memory cell storing H level data in the semiconductor memory device of the first embodiment.

FIG. 9 shows a flowing path of a leakage current in the case when H level data is stored in the storage node. The voltage level of the H level data decreases due to an off-leakage current Ioff flowing toward impurity region 12a, and a gate leakage current Ig flowing from the storage node via a capacitor insulating film to cell plate electrode CP (conductive layer 15). In a stand-by state, as in the previous case of storing L level data, word line WL is biased positively with respect to the source (12b), memory transistor MTR is in a deep off state, and off-leakage current Ioff is substantially negligible. Thus, the voltage decrease of the H level data is essentially determined by the gate leakage current Ig.

If gate leakage current Ig becomes large when the capacitor insulating film of the memory capacitor is made the same in film thickness as the gate insulating film of the logic transistor, then the insulating film of the memory cell capacitor is made thicker than the gate insulating film of the logic transistor formed in the same manufacturing step (utilizing the dual gate oxide film process). Where the capacitance and area of the memory cell capacitor are represented as Cs and Scell, respectively, and a target data holding time is represented by tREF, a permissible gate leakage current Igmax is given by the following expression:

$$Ig\max = Cs \cdot VCCS/(tREF \cdot Scell).$$

Thus, the film thickness of the insulating film of the memory cell capacitor is appropriately set such that the relation of Ig<<Igmax holds. Accordingly, at least a bit line read voltage from the memory cell storing the H level data in the twin cell unit of 1 bit/2 cells can be secured sufficiently.

With the measure as described above, the pause refresh characteristics can be ensured.

Disturb Refresh Characteristics

Figure 10:
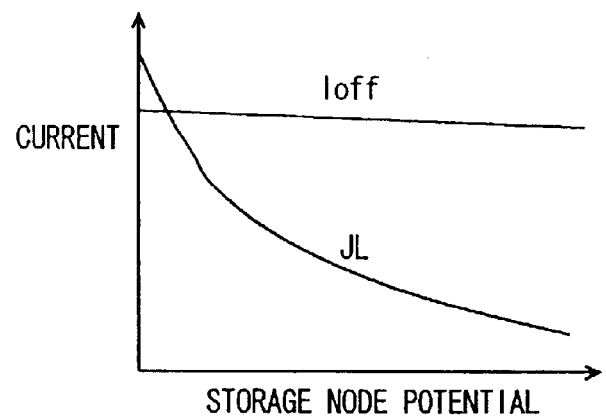
FIG. 10 illustrates the relation between the storage node potential and the leakage current.

Next, the disturb refresh characteristics will be described. It is now assumed that word line WL is at a high voltage VP level and bit line BL (conductive layer 16) is at an H level. FIG. 10 shows the relation between a potential of the storage node and a leakage current under this state. In FIG. 10, the horizontal axis represents the potential of the storage node, and the vertical axis represents the magnitude of the leakage current. As the potential of the storage node of the memory cell storing L level data increases, the junction bias between P type impurity region 12b and N well region 11 shown in FIG. 8 decreases, and the backward leakage current decreases exponentially to cause a rapid lowering of junction leakage current JL, as shown in FIG. 10. With regard to off-leakage current Ioff, as the potential of the storage node increases, the drain-source voltage Vds of memory cell transistor MTR merely decreases. Since the source of the memory transistor MTR is the bit line under this state, the gate-source voltage of the memory transistor is not affected. Thus, off-leakage current Ioff decreases slowly. That is, while the rising speed of the storage node potential due to the junction leakage current rapidly decreases, the rising speed of the storage node potential due to the off-leakage current Ioff slowly decreases.

Thus, in the case where non-selected word line WL is set to an array power supply voltage VCCS level, if H level data appears on the corresponding bit line BL, the effect of the off-leakage current Ioff cannot be neglected. In particular, since memory transistor MTR, similar to the logic transistor, has a small absolute value of threshold voltage (the memory transistor and the logic transistor are formed in the same manufacturing step), the off-leakage current becomes large, and the disturb refresh characteristics is deteriorated. However, by setting the non-selected word line WL to a high voltage VP level higher than the voltage (VCCS) of the H level data, the gate of memory cell transistor MTR is biased positively with respect to the source thereof, and thus, the off-leakage current Ioff can be decreased. Accordingly, the degradation of the disturb refresh characteristics is suppressed.

Figure 11:
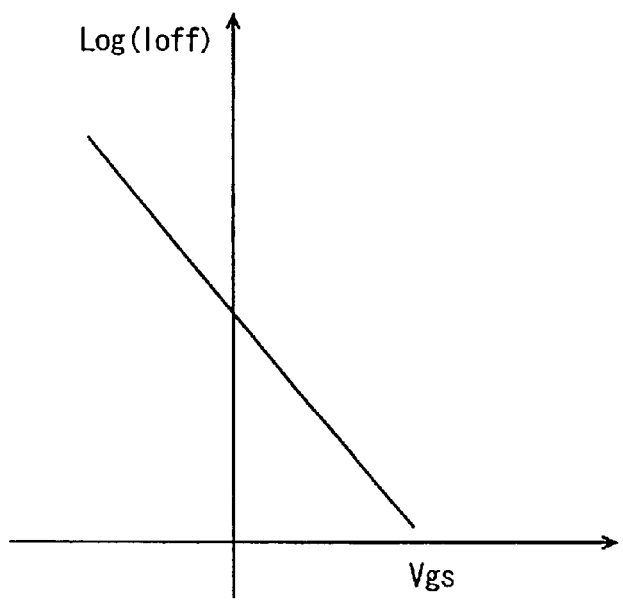
FIG. 11 shows sub-threshold characteristics of a memory cell transistor.

That is, in a so-called sub-threshold region, as shown in FIG. 11, when the gate-source voltage Vgs is biased positively in the P channel MOS transistor, off-leakage current (sub-threshold current) Ioff decreases exponentially. Here, in FIG. 11, the vertical axis represents a logarithmic value of off-leakage current Ioff and the horizontal axis represents gate-source voltage Vgs.

Specifically, each time gate-source voltage Vgs increases by 0.1 V, off-leakage current Ioff decreases by approximately an order of one digit. Thus, by maintaining the non-selected word line WL to the high voltage VP level, gate-source voltage Vgs of the non-selected memory cell can be biased positively, and off-leakage current Ioff can be suppressed reliably. Accordingly, the disturb refresh characteristics is significantly improved.

In a selected memory cell, a voltage Vb equal to sense power supply voltage VCCS is applied across the gate insulating film of its memory transistor. Only while the memory cell is selected, the voltage Vb is applied and the time duty of application of the voltage Vb is small, and dielectric breakdown characteristics is normally guaranteed for sense power supply voltage VCCS, and thus no problem arises. In contrast, in a non-selected memory cell, although the time duty of the non-selected state is large, the voltage Va applied across the gate insulating film of the memory transistor corresponds to a difference between high voltage VP and a voltage ZBLL (V) on the L level bit line, and is smaller by the voltage ZBLL (V) than in the case where the L level bit line is driven to a ground voltage level. Here, voltage ZBLL (V) of the L level bit line is equal to an absolute value of the threshold voltage of the bit line isolation gate. Thus, if the difference α between high voltage VP and sense power supply voltage VCCS is approximately at the same level as voltage ZBLL (V), sufficient dielectric breakdown voltage can be secured for the memory transistor. Thus, reliability of the gate insulating film of the non-selected memory cell can be ensured.

The voltage level of the L level data transmitted to the bit line BL becomes higher than the ground voltage, and the voltage level of the L level data stored in the storage node also becomes higher than the ground voltage. However, as the H level data and the L level data are read out to bit lines BLL and ZBLL, a sufficient voltage difference for the sense amplifier is ensured, because of the following reasons.

As to the H level data, data of full VCCS can be written and read. As to the L level data, the off-leakage current Ioff is restrained, and the junction leakage current JL is also sufficiently restrained because the L level data is higher in voltage level than the ground voltage level. Thus, the rising speed of the potential of the storage node of the memory cell storing the L level data in data holding becomes sufficiently moderate. Accordingly, the L level data read out voltage at the time of reading the L level data onto the bit line can be secured to a certain degree. Accordingly, the disturb data retention characteristics (disturb refresh characteristics), although slightly degraded compared to the case of writing L level data of a ground voltage level, can be improved sufficiently compared to the case where a word line is changed between the sense power supply voltage VCCS level and the ground voltage VSSS level.

In particular, the maximum value of the voltage applied across the gate insulating film of memory cell transistor MTR is mitigated by an absolute value of the threshold voltage of transfer gate PTG of the bit line isolation gate. Thus, by appropriately setting the threshold voltage of transfer gate PTG of the bit line isolation gate, the condition of Va≦VCCS is realized, eliminating the problem of reliability of the gate insulating film.

Figure 12:
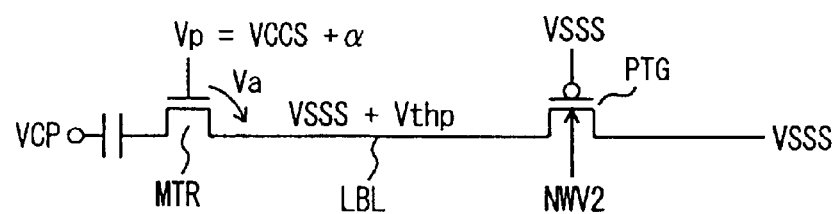
FIG. 12 illustrates applied voltages of a non-selected memory cell and a bit line isolation gate in the first embodiment.

Particularly, as shown in FIG. 12, transfer gate PTG of the bit line isolation gate connected to bit line LBL driven to an L level has its source being the L level bit line LBL, and the back gate-source is biased positively. The absolute value Vthp of the threshold voltage of transfer gate PTG becomes greater than in the case where the source and the back gate are at the same voltage level. Thus, it becomes readily possible to satisfy the condition of setting the voltage Va shown in FIG. 7 to not greater than sense power supply voltage VCCS.

If the set value of α is made larger to sufficiently suppress off-leakage current Ioff, or if the set value of the absolute value of the threshold voltage of the logic transistor is low and the potential VSSS+Vthp=ZBLL (V) of the L level bit line LBL is low, the condition Va≦VCCS may possibly not be satisfied.

In such a case, well bias voltage NWV2 of transfer gate PTG is set appropriately to increase the absolute value of the threshold voltage of this transistor PTG of the bit line isolation gate for raising the voltage level of the L level bit line LBL, so that the condition Va≦VCCS can be satisfied.

Figure 13:
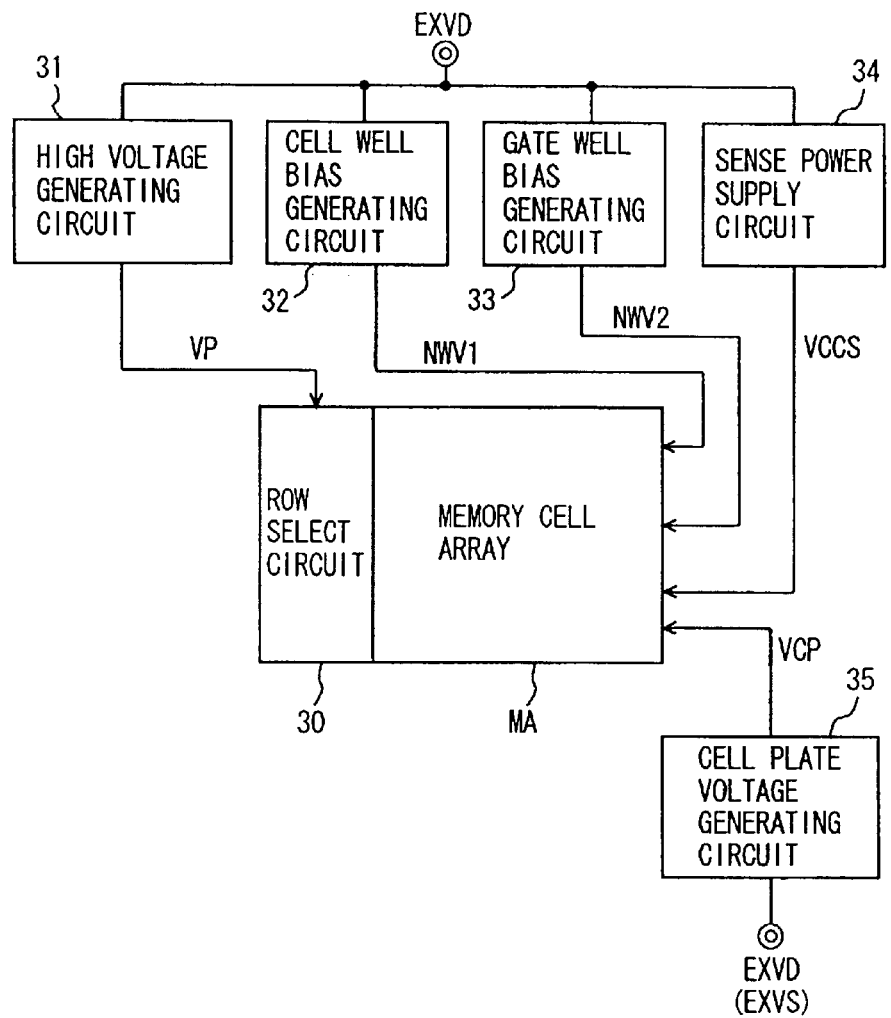
FIG. 13 schematically shows an internal voltage generating circuit in the semiconductor memory device according to the first embodiment.

FIG. 13 schematically shows a configuration of an internal voltage generating portion of the semiconductor memory device according to the present invention. Referring to FIG. 13, a row select circuit 30 is provided for memory cell array MA. This row select circuit 30 is supplied with a high voltage VP which is generated from an external power supply voltage EXVD by a high voltage generating circuit 31. A well region of the memory cell formation region (not shown) of the memory cell array is supplied with an N well bias voltage NWV1 from a cell well bias generating circuit 32. A bit line isolation gate formation region of this memory cell array MA is supplied with an N well bias voltage NWV2 from a gate well bias generating circuit 33. To a sense amplifier included in a peripheral circuit of memory cell array MA, a sense power supply voltage VCCS is supplied from a sense power supply circuit 34. To a cell plate electrode line of memory cell array MA, a cell plate voltage VCP is supplied from a cell plate voltage generating circuit 35. External power supply voltage EXVD is supplied to the circuits 31–35 as the power supply voltage.

Since the well bias voltages are not lower than the array power supply voltage VCCS, well bias generating circuits 32 and 33 perform charge pumping operations, for example, to generate well bias voltages NWV1 and NWV2, respectively. If well bias voltages NWV1 and NWV2 are at a voltage level between the external power supply voltage EXVD and array power supply voltage VCCS, they may be generated by voltage-dividing the external power supply voltage EXVD. Well bias voltages NWV1 and NWV2 may have the same voltage level or different voltage levels from each other. What is required is that voltage levels of well bias voltages NWV1 and NWV2 can be set independently of each other.

Sense power supply circuit 34, formed of, e.g., a voltage down converting circuit, internally lowers the external power supply voltage EXVD to generate sense power supply voltage VCCS. In the case where external power supply voltage EXVD is used as the sense power supply voltage, sense power supply circuit 34 is formed of a noise removing circuit such as a low pass filter.

High voltage generating circuit 31 generates high voltage VP based on the charge pumping operation or the like according to external power supply voltage EXVD.

When the cell plate voltage VCP is a ground voltage, cell plate voltage generating circuit 35 receives an external ground voltage EXVS instead of external power supply voltage EXVD, and generates the cell plate voltage VCP. When cell plate voltage VCP is at a negative voltage level, cell plate voltage generating circuit 35 performs the charge pumping operation and generates the negative cell plate voltage VCP from external power supply voltage EXVD.

Figure 14:
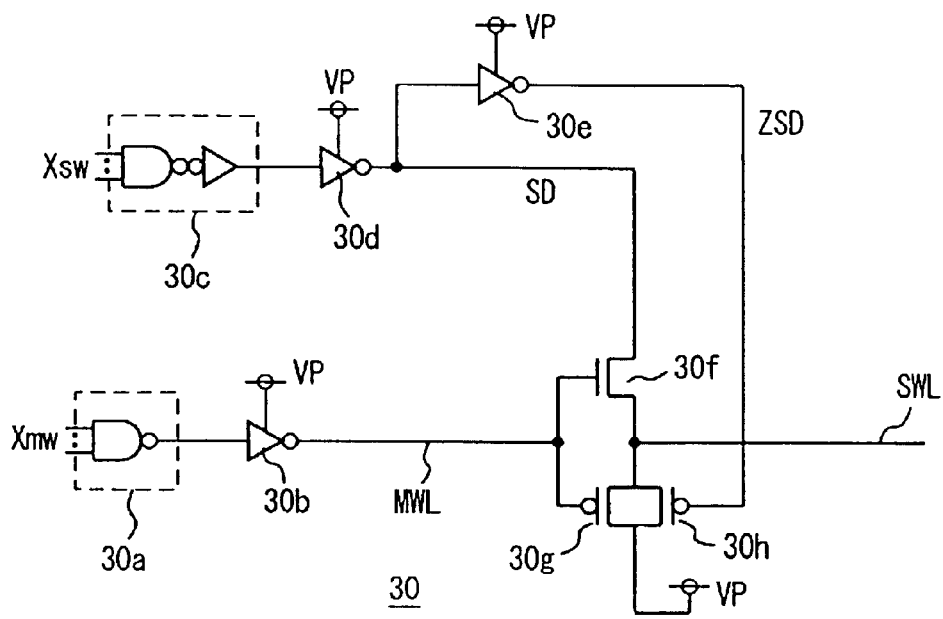
FIG. 14 shows an exemplary configuration of the row select circuit shown in FIG. 13.

FIG. 14 shows a configuration of a portion of row select circuit 30 in FIG. 13 related to a word line. This word line WL is formed of a hierarchical word line including a main word line MWL and a sub-word line SWL. The main word line is provided corresponding to a predetermined number of sub-word lines SWL. Four or eight sub-word lines SWL may be provided for one main word line MWL.

Referring to FIG. 14, the row select circuit 30 includes: a main word line decode circuit 30a which decodes a main word line address signal Xmw; a buffer circuit 30b which level-converts an output signal of main word line decode circuit 30a to a signal of a high voltage VP level for transmission onto main word line MWL; a sub-word line decode circuit 30c which decodes a sub-word line address signal Xsw; an inverter 30d which inverts and level-converts an output signal of sub-word line decode circuit 30c to generate a sub-decode signal SD; an inverter circuit 30e which receives high voltage VP as an operating power supply voltage, inverts an output signal of inverter 30d with the level converting function, and generates a complementary sub-decode signal ZSD; an N channel MOS transistor 30f which is responsive to a signal on main word line MWL for transmitting sub-decode signal SD to sub-word line SWL; a P channel MOS transistor 30g which is responsive to the signal of main word line MWL for transmitting high voltage VP to sub-word line SWL; and a P channel MOS transistor 30h which transmits high voltage VP to sub-word line SWL in accordance with complementary sub-decode signal ZSD.

Address signals Xmw and Xsw applied to decode circuits 30a and 30c may be pre-decode signals.

When main word line MWL is addressed, main word line decode circuit 30a outputs a signal of the ground voltage level. Inverter circuit 30b with the level converting function drives the selected main word line MWL to the high voltage VP level. Main word line MWL, when non-selected, maintains the ground voltage level.

Sub-word line decode circuit 30c outputs a signal of an H level when sub-word line SWL is addressed. Thus, when sub-word line SWL is selected, sub-decode signal SD attains a ground voltage level, and complementary sub-decode signal ZSD attains an H level of high voltage VP level. When sub-word line SWL is non-selected, sub-decode signal SD is at the high voltage VP level, and complementary sub-decode signal ZSD is at the ground voltage level.

In the configuration of the word line select circuit shown in FIG. 14, when main word line MWL is in a non-selected state, P channel MOS transistor 30g is in an on state (conductive state), and MOS transistor 30f is in an off state (non-conductive state). Sub-word line SWL is maintained at the high voltage VP level by MOS transistor 30g.

When main word line MWL is selected, main word line MWL is driven to the high voltage VP level, and MOS transistor 30f turns on state and MOS transistor 30g turns off state. When sub-decode signal SD is at a ground voltage level, MOS transistor 30f transmits sub-decode signal SD of the ground voltage level onto sub-word line SWL, and sub-word line SWL attains a selected state. At this time, complementary sub-decode signal ZSD is at a high voltage VP level, and MOS transistor 30h is in an off state.

When main word line MWL is selected and sub-decode signal SD is at the high voltage VP level, MOS transistor 30f transmits a signal of a high voltage VP—Vthn level to sub-word line SWL. Here, Vthn represents a threshold voltage of MOS transistor 30f. At this time, due to sub-decode signal ZSD being at an L level, MOS transistor 30h is in an on state and sub-word line SWL remains at the high voltage VP level.

Thus, by utilizing the decode circuit and the sub-word line drive circuit as shown in FIG. 14, the sub-word line SWL can be driven to a ground voltage level when selected, and maintained at a high voltage VP level when non-selected.

Figure 15:
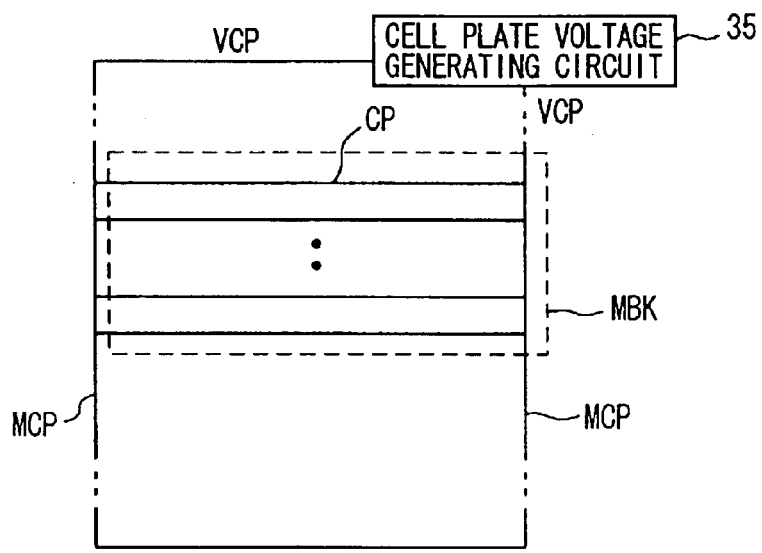
FIG. 15 schematically shows a transmission path of the cell plate voltage shown in FIG. 13.

FIG. 15 schematically shows an arrangement of cell plate electrode lines. In FIG. 15, the arrangement of cell plate electrode lines CP for one memory block MBK is shown. Cell plate electrode lines CP are coupled to a main cell plate electrode line MCP that is commonly provided for a plurality of memory blocks. Cell plate electrode lines CP are arranged extending in a row direction within the memory block MBK. Main cell plate electrode line MCP is coupled to cell plate voltage generating circuit 35, and transmits cell plate voltage VCP from cell plate voltage generating circuit 35.

Cell plate electrode lines CP are coupled to main cell plate electrode line MCP in the periphery of memory block MBK, so that cell plate electrode lines CP can be formed in the same interconnection layer as the word lines.

In the arrangement of cell plate electrode lines CP shown in FIG. 15, main cell plate electrode line MCP may be arranged extending in a column direction in a sub-word driver band where sub-word drivers (MOS transistors 30f–30h in FIG. 14) are placed.

Figure 16:
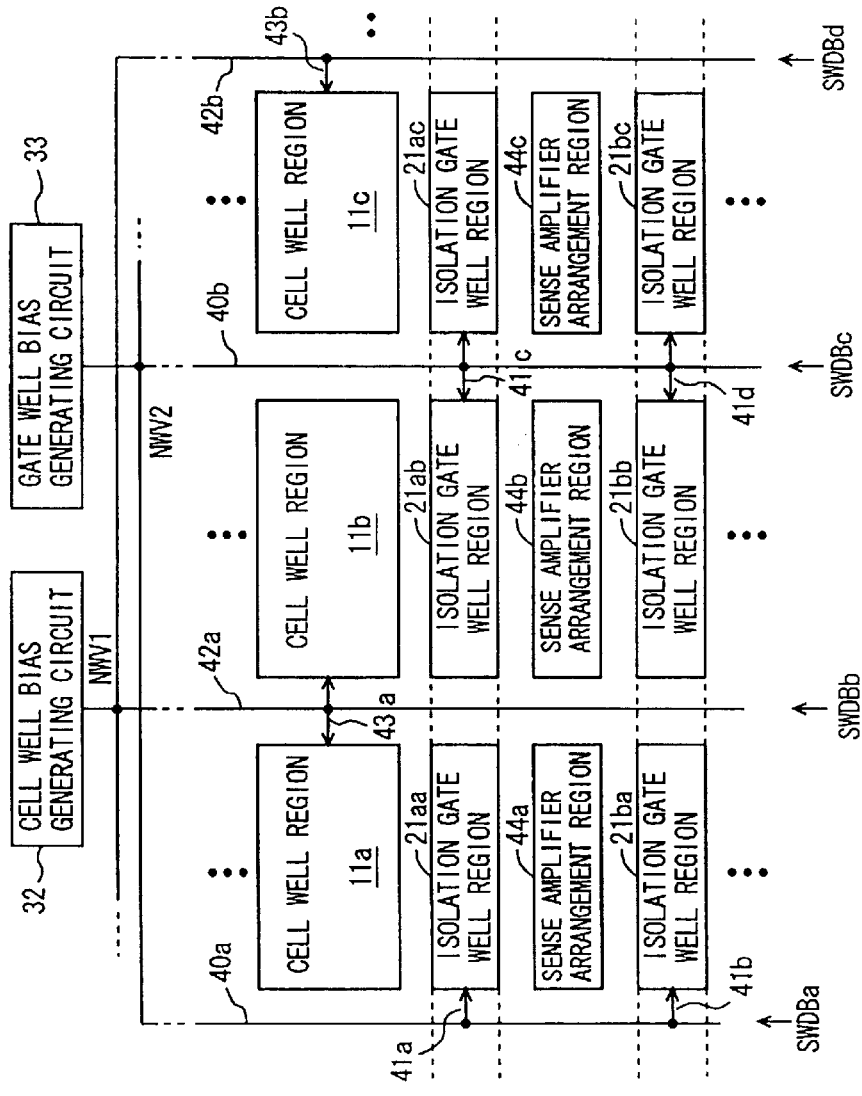
FIG. 16 schematically shows transmission paths of the well bias voltages shown in FIG. 13.

FIG. 16 schematically shows exemplary transmission paths of the well bias voltages. Referring to FIG. 16, a row block is divided into a plurality of sub-blocks. These sub-blocks are isolated from each other by sub-word driver bands SWDBa–SWDBd. Each sub-block includes sub-word lines, to which memory cells in the corresponding sub-block are connected.

Cell well regions 11a, 11b and 11c are provided for formation of the memory cells of the sub-blocks. These cell well regions 11a–11c are isolated from each other by sub-word driver bands SWDBb and SWDBc.

Isolation gate well regions 21aa–21ac for arrangement of isolation gates are formed corresponding to cell well regions 11a–11c. These isolation gate well regions 21aa–21ac are also isolated from each other by sub-word driver bands SWDBb and SWDBc.

Sense amplifier arrangement regions 44a–44c for formation of sense amplifiers are disposed adjacent to isolation gate well regions 21aa–21ac. The sense amplifiers include a P sense amplifier formed of P channel MOS transistors and an N sense amplifier formed of N channel MOS transistors. Thus, in sense amplifier arrangement region 44a–44c, a region for disposing P channel MOS transistors and a region for disposing N channel MOS transistors are provided. Therefore, a triple well structure or a twin well structure may be employed for the sense amplifier arrangement region 44a–44c.

Isolation gate well regions 21ba–21bc are provided adjacent to sense amplifier arrangement regions 44a–44c for formation of isolation gates provided for another memory block.

Well bias voltage NWV1 from cell well bias generating circuit 32 is transmitted via cell well bias voltage transmission lines 42a and 42b disposed in sub-word driver bands SWDBb and SWDBd, respectively. Cell well bias voltage transmission lines 42a and 42b are formed of, e.g., a second metal interconnection, and are arranged extending in a column direction. Cell well bias voltage transmission line 42a is coupled to cell well regions 11a and 11b by a lead interconnection line 43a. Cell well bias voltage transmission line 42b is coupled to cell well region 11c via a lead interconnection line 43b. These lead interconnection lines 43a and 43b each include an intermediate interconnection line and a contact, and electrically connect well bias voltage transmission lines 42a and 42b to well regions 11a–11c.

Gate well bias voltage NWV2 from gate well bias generating circuit 33 is transmitted by gate well bias voltage transmission lines 40a and 40b extending in a column direction in sub-word driver bands SWDBa and SWDBc, respectively. Gate well bias voltage transmission line 40a is coupled to isolation gate well regions 21aa and 21ba via extract interconnections 41a and 41b. Gate well bias voltage transmission line 40b is connected to isolation gate well regions 21ab and 21ac via an extract interconnection 41c, and also coupled to isolation gate well regions 21bb and 21bc via an extract interconnection 41d.

In the arrangement shown in FIG. 16, the isolation gate well regions may be formed continuously extending in a row direction. Bias voltage transmission lines 40a, 40b, 42a and 42b may be inter-coupled to each other by voltage transmission lines extending in a row direction in the sense amplifier bands for the purpose of power strengthening.

In the case where isolation gate well regions 21aa–21ac extend continuously in a row direction (as shown in broken lines in FIG. 16) and isolation gate well regions 21ba–21bc are also formed extending continuously in a row direction, well bias voltage transmission lines 40a and 40b are electrically connected to the well regions in the sub-word driver bands.

FIG. 17 shows an exemplary configuration of a portion for generating bit line isolation instructing signals and sense amplifier activating signals. In FIG. 17, the configuration of a control signal generating portion arranged for bit line isolation circuits BIKL and BIKR and sense amplifier band SAB is shown. Bit line isolation circuit BIKL, when conductive, connects sense amplifier band SAB to memory block MBKL. Bit line isolation circuit BIKR, when conductive, connects sense amplifier band SAB to memory block MBKR.

For bit line isolation circuit BIKL, a AND circuit 50 which receives an array activating signal RACT and a memory block select signal BSR, and a level shift circuit 51 which level-converts an output signal of AND circuit 50 to generate bit line isolation instructing signal BLIL are provided. Array activating signal RACT is a signal for activating a row selection operation, and is maintained in an active state while row selection is performed in the semiconductor memory device (i.e., during the array activated time period).

Block select signal BSR attains an H level of an active state when memory block MBKR is selected. Level shift circuit 51 converts bit line isolation instructing signal BLIL to a high voltage VP level when the output signal of AND circuit 50 is at an H level. Since a transistor of the peripheral circuit is formed with a logic transistor, a voltage of the same voltage level as the sense power supply voltage may be used as the operating power supply voltage. Alternatively, to achieve high-speed operability, a power supply voltage, used in the peripheral circuitry, having a voltage level different from the sense power supply voltage may be used as the operating power supply voltage.

For sense amplifier band SAB, there are provided an OR circuit 52 which receives block select signals BSR and BSL, a NAND circuit 53 which receives a main sense amplifier activating signal MSOP and an output signal of OR circuit 52 to generate a sense amplifier activating signal SOP, and an AND circuit 54 which receives the output signal of OR circuit 52 and a main sense amplifier activating signal MSON to generate a sense amplifier activating signal SON. To sense amplifier band SAB, sense power supply voltage VCCS and sense ground voltage VSSS are transmitted. Sense amplifier activating signals SOP and SON each have an amplitude of a sense power supply voltage VCCS level. However, the amplitude of sense amplifier activating signals SOP and SON may be a peripheral power supply voltage VCC level different from the sense power supply voltage level.

To dispose a sense power supply line and a sense ground line for transmitting sense power supply voltage VCCS and sense ground voltage VSSS in sense amplifier band SAB, conventional meshed shape sense power supply arrangement may be employed, with the voltage transmission lines being arranged in a meshed shape.

Block select signal BSL attains an active state of an H level when memory block MBKL is selected. Main sense amplifier activating signals MSOP and MSON are both at an H level when activated. Sense amplifier activating signal SOP is at an L level when activated, and sense amplifier activating signal SON is at an H level when activated.

Block select signals BSL and BSR are generated by decoding a block address signal included in an address signal.

For bit line isolation circuit BIKR, there are provided an AND circuit 55 which receives block select signal BSL and array activating signal RACT, and a level shift circuit 56 which level-converts an output signal of AND circuit 55 to generate bit line isolation instructing signal BLIR. Level shift circuit 56 converts an H level of the output signal of AND circuit 55 to a signal of high voltage VP level.

In the configuration shown in FIG. 17, in a stand-by state, array activating signal RACT is at an L level, and the output signals of AND circuits 50 and 55 are both at an L level. Thus, bit line isolation instructing signals BLIL and BLIR from level shift circuits 51 and 56 are both at an L level, and bit line isolation circuits BIKL and BIKR are both conductive. Accordingly, sense amplifier band SAB is connected to memory blocks MBKL and MBKR. Main sense amplifier activating signals MSOP and MSON are both in an inactive state. Sense amplifier activating signal SOP output from NAND circuit 53 is at an H level, and sense amplifier activating signal SON output from AND circuit 54 is at an L level. Sense amplifiers in sense amplifier band SAB maintain an inactive state.

When a memory cycle for memory cell selection starts, array activating signal RACT rises to an H level, and AND circuits 50 and 55 operate as buffer circuits. Upon selection of memory block MBKL, block select signal BSL attains an H level of a selected state, while block select signal BSR maintains an L level of an non-selected state. The output signal of AND circuit 50 is at an L level, and bit line isolation instructing signal BIL from level shift circuit 51 is at an L level of the ground voltage level. Thus, bit line isolation circuit BIKL remains conductive, and sense amplifier band SAB is connected to memory block MBKL.

When block select signal BSL and array activating signal RACT both attain an H level, AND circuit 55 outputs a signal of an H level. In response, bit line isolation instructing signal BLIR output from level shift circuit 56 attains the high voltage VP level, and bit line isolation circuit BIKR is rendered non-conductive. Accordingly, sense amplifier band SAB is isolated from memory block MBKR.

When a memory cell in memory block MBKL is selected and data of a twin cell unit is read out onto an associated bit line pair, main sense amplifier activating signals MSON and MSOP are driven to an H level. Since block select signal BSL is at an H level, the output signal of OR circuit 52 is at an H level. When main sense amplifier activating signal MSOP attains an H level, sense amplifier activating signal SOP from NAND circuit 53 attains an L level. AND circuit 54 drives sense amplifier activating signal SON to an H level in response to rising of main sense amplifier activating signal MSON. In response, sense amplifiers in sense amplifier band SAB are activated, and perform sensing, amplification and latching of data of selected memory cells in memory block MBKL.

Thereafter, a column related circuit (not shown) performs a column select operation, and data writing/reading on a sense amplifier in sense amplifier band SAB arranged corresponding to the selected column is carried out.

Upon completion of the memory cycle, array activating signal RACT attains an L level, and main sense amplifier activating signals MSOP and MSON each attain an L level. Thus, the selected word line in memory block MBKL turns non-selected state, and the sense amplifiers in sense amplifier band SAB are inactivated. Further, bit line isolation instructing signal BLIR attains an L level, and bit line isolation circuit BIKR is rendered conductive. Memory block MBKR is connected to sense amplifier band SAB thorough bit line isolation circuit BIKR. Thereafter, bit line precharge/equalize circuits (not shown) perform precharge/equalize operations of the bit lines in memory blocks MBKL and MBKR.

The bit line precharge/equalize circuits are placed adjacent to bit line isolation circuits BIKL and BIKR in respective memory blocks MBKL and MBKR. They are activated/inactivated in accordance with the block select signals.

FIG. 18 shows an exemplary configuration of a sense amplifier SA included in sense amplifier band SAB shown in FIG. 17. Referring to FIG. 18, sense amplifier SA is electrically connected to a sense power supply line 58 via a sense amplifier activating transistor 60, and also connected to a sense ground line 59 via a sense amplifier activating transistor 62. These sense power supply line 58 and sense ground line 59 are arranged extending continuously in a row direction in a corresponding sense amplifier band SAB.

The set of sense amplifier activating transistors 60 and 62 is provided for each predetermined number of sense amplifiers SA. Sense amplifier activating transistors 60 and 62 are disposed in a sub-word driver band, for example. Sense amplifier activating transistor 60 is rendered conductive when sense amplifier activating signal SOP is activated (at an L level), and transmits sense power supply voltage VCCS on sense power supply line 58 to a sense power supply node 67a. Sense amplifier activating transistor 62 is rendered conductive, when sense amplifier activating signal SON is activated, for transmitting the ground voltage VSSS on sense ground line 59 to a sense ground node 67b.

Sense amplifier SA includes: a P channel MOS transistor 63 which is connected between sense power supply node 67a and a common bit line CBL and has a gate connected to a common bit line ZCBL; a P channel MOS transistor 64 which is connected between sense power supply node 67a and common bit line ZCBL and has a gate connected to common bit line CBL; an N channel MOS transistor 65 which is connected between sense ground node 67b and common bit line CBL and has a gate connected to common bit line ZCBL; and an N channel MOS transistor 66 which is connected between sense ground node 67b and common bit line ZCBL and has a gate connected to common bit line CBL.

Common bit lines CBL and ZCBL are connected to isolation gates included in bit line isolation circuits BIKL and BIKR.

This sense amplifier SA drives a common bit line at a higher potential of common bit lines CBL and ZCBL to a sense power supply voltage VCCS level by means of the cross-coupled P channel MOS transistors 63 and 64. Cross-coupled N channel MOS transistors 65 and 66 drive the common bit line at a lower potential of common bit lines CBL and ZCBL to the ground voltage level.

In sense amplifier SA, MOS transistors 63 and 65 constitute a first inverter, and MOS transistors 64 and 66 constitute a second inverter. These first and second inverters have their inputs and outputs cross-coupled to each other to form an inverter latch. Thus, after completion of sensing and amplifying operations, sense amplifier SA latches the voltages of common bit lines CBL and ZCBL to sense power supply voltage VCCS level and sense ground voltage VSSS level according to read out data.

Sense ground voltage VSSS has the same voltage level as the L level of bit line isolation instructing signals BLIL and BLIR. Thus, for the L level data, there is caused a voltage difference corresponding to the absolute value of the threshold voltage of the P channel MOS transistor of the isolation gate between common bit lines CBL, ZCBL and bit lines BLL, ZBLL in memory block MBKL or MBKR.

Voltage shift by the threshold voltage is utilized to alleviate the voltage applied across the gate insulating film of a non-selected memory cell transistor in the negative voltage word line driving scheme.

As described above, according to the first embodiment of the present invention, the memory cell capacitor has a planar type structure to reduce unevenness or a step in the capacitor portion. Therefore, it is possible to fabricate the memory cell and the logic transistor in the same manufacturing steps, and thus to reduce manufacturing cost.

Further, the 1-bit/2-cell mode where data of one bit is stored by memory cells of two bits is employed to compensate for reduction in capacitance value of the planar type capacitor. Therefore, a sufficiently large read voltage difference can be obtained between bit lines, so that adequate data retention characteristics is ensured.

Still further, the non-boosted word line scheme and the negative voltage word line driving scheme are used in combination, and therefore, disturb refresh characteristics can be improved without degrading insulating characteristics of a non-selected memory cell. The threshold voltage loss via a bit line isolation gate between a sense amplifier and a bit line is utilized to cause threshold voltage shift between a voltage level of the bit line and a voltage level of latch data of the sense amplifier. This further alleviates the voltage applied across the gate insulating film of the non-selected memory cell, to ensure reliability of the gate insulating film of the memory cell transistor.

The amplitude of the bit line isolation instructing signals is the same as the voltage amplitude of the word line. Thus, it is possible to generate the bit line isolation instructing signals utilizing the high voltage applied to the row selection circuit. In this case, the bit line isolation instructing signal generating circuit and the row selection circuit can be formed in a common well region. However, since the bit line isolation instructing signals is only required to have an L level set to a ground voltage level, even if the H level of the bit line isolation instructing signal is at the sense power supply voltage level, isolation of a non-selected memory block from a sense amplifier band can be ensured.

Second Embodiment

Figure 19:
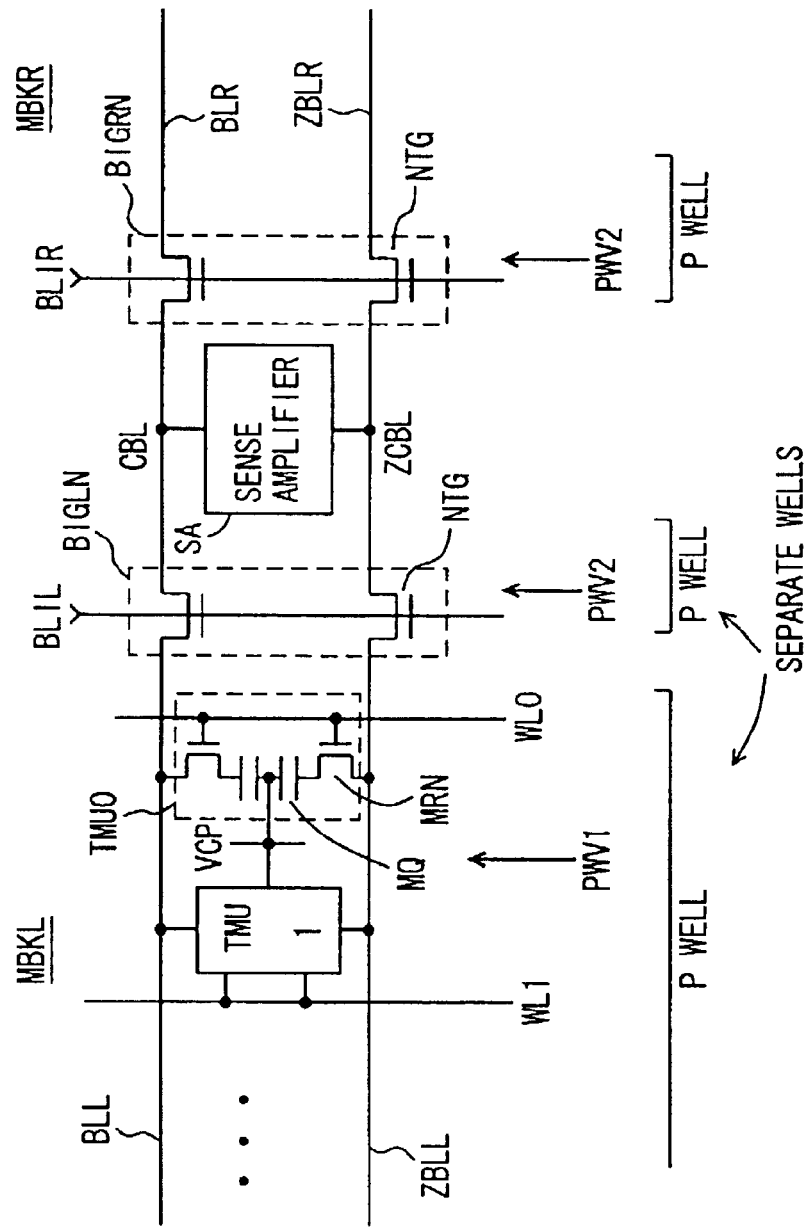
FIG. 19 schematically shows a configuration of a main portion of the semiconductor memory device according to a second embodiment of the present invention.

FIG. 19 shows a configuration of a main portion of the semiconductor memory device according to the second embodiment of the present invention. In FIG. 19, the configuration of a portion related to memory cells is shown. Referring to FIG. 19, the memory block MBKL includes a twin cell unit TMU0 arranged corresponding to a crossing of word line WL0 and bit lines BLL and ZBLL, and another twin cell unit TMU1 arranged corresponding to a crossing of word line WL1 and bit lines BLL and ZBLL.

Twin cell units TMU0 and TMU1 each have a memory transistor MRN formed of an N channel MOS transistor. Twin cell units TMU0 and TMU1 each include DRAM cells of two bits. The layout of the memory cells constituting these twin cell units TMU0 and TMU1 is identical to the layout of memory cells MC shown in FIG. 4.

Since twin cell units TMU0 and TMU1 include the N channel MOS transistors as memory transistors MRN, memory block MBKL is formed in a P well. Normally, a well bias voltage PWV1 of a negative voltage level is applied to the P well region of memory block MBKL.

Cell plate voltage VCP applied to memory cell capacitors MQ included in twin cell units TMU0 and TMU1 is set to a sense power supply voltage level, since the memory cell capacitors each have an insulating film substantially the same in film thickness as the logic transistor.

Bit lines BLL and ZBLL are connected to common bit lines CBL and ZCBL via a bit line isolation gate BIGLN. Bit line isolation gate BIGLN includes transfer gates NTG formed of N channel MOS transistors. Bit line isolation gate BIGLN is formed in a P well region different from the P well region where memory block MBKL is arranged. A bias voltage PWV2 is supplied to the back gates of these transfer gates (MOS transistors) NTG.

Common bit lines CBL and ZCBL are connected to sense amplifier SA. Common bit lines CBL and ZCBL are also connected to bit lines BLR and ZBLR disposed in memory block MBKR via a bit line isolation gate BIGRN. Bit line isolation gate BIGRN also includes transfer gates NTG formed of N channel MOS transistors, and bias voltage PWV2 is supplied to the back gates of these MOS transistors (transfer gates) NTG. P well regions for formation of bit line isolation gate BIGRN and for formation of memory block MBKR are provided separately from each other.

Figure 20:
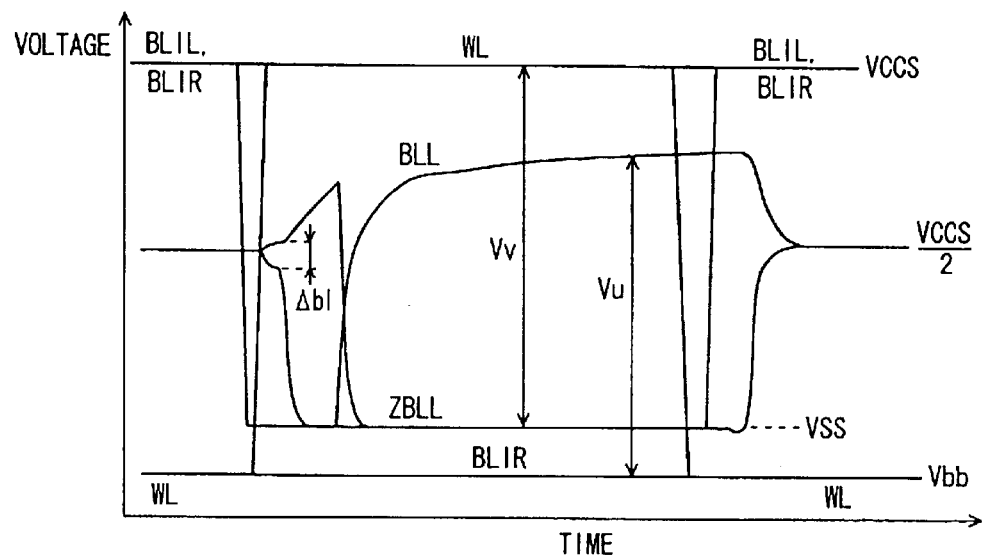
FIG. 20 shows signal waveforms representing an operation of the configuration shown in FIG. 19.

FIG. 20 shows signal waveforms illustrating an operation of the semiconductor memory device shown in FIG. 19. Now, the operation of the device in FIG. 19 will be described with reference to FIG. 20.

In a stand-by state, bit line isolation instructing signals BLIL and BLIR are both at a sense power supply voltage VCCS level, and bit line isolation gates BIGLN and BIGRN are both conductive. Common bit lines CBL and ZCBL are electrically connected to bit lines BLL, BLR and ZBLL, ZBLR, respectively. In this state, these bit lines are maintained at a voltage level of intermediate voltage (VCCS/2) by bit line precharge/equalize circuits (not shown).

In the stand-by state, word line WL (WL0, WL1) is maintained at a negative voltage Vbb level. When a memory cycle starts, first, block select and row select operations are performed in accordance with an address signal applied. Now, it is assumed that word line WL0 is selected in memory block MBKL. In this state, bit line isolation instructing signal BLIR falls to a ground voltage VSS level, and bit line isolation gate BIGRN is rendered non-conductive to isolate bit lines BLR and ZBLR from common bit lines CBL and ZCBL. Bit line isolation instructing signal BLIL maintains the sense power supply voltage VCCS level.

Then, the voltage level of selected word line WL (WL0) rises from a negative voltage Vbb to the sense power supply voltage VCCS level. Thus, the complementary data stored in twin cell unit TMU0 are transmitted onto bit lines BLL and ZBLL. When the voltage difference Δb1 between bit lines BLL and ZBLL becomes sufficiently large, sense amplifier SA is activated, and the voltage levels of bit lines BLL and ZBLL are changed by the sensing and amplifying operations of sense amplifier SA.

When the sensing operation is completed, column selection is performed in a predetermined timing, and data writing to a selected column is carried out (the column related circuit is not shown in this figure). Thus, the voltage levels of latch data of sense amplifier SA change to voltage levels corresponding to the write data. Here, it is assumed that H level data is written. In this case, in bit line isolation gate BIGLN, transfer gate NTG receives a signal of the sense power supply voltage VCCS level at its gate, and L level data is transmitted onto bit line ZBLL. In contrast, the H level data of the sense power supply voltage VCCS level undergoes threshold voltage loss at transfer gate (MOS transistor) NTG, and its voltage level decreases from the sense power supply voltage VCCS by the threshold voltage of transfer gate (MOS transistor) NTG. When the bit line potential of an H level rises, the gate-source voltage difference of this transfer gate (MOS transistor) NTG becomes small, and the on resistance of the transfer gate becomes large. Thus, the voltage level of bit line BLL changes moderately.

When the memory cycle is completed, selected word line WL (WL0) is driven to a negative voltage Vbb level of a non-selected state. Bit line isolation instructing signal BLIR rises form negative voltage Vbb to the sense power supply voltage VCCS level.

Further, the bit line precharge/equalize circuits (not shown) are activated, and bit lines BLL and ZBLL are driven to an intermediate voltage level.

As shown in FIG. 20, in the configuration where the memory cell transistors are formed of N channel MOS transistors, the non-selected word line WL is set to a negative voltage Vbb level according to the negative voltage word line driving scheme. Thus, in the stand-by state, the memory cell transistors are set to a deep off state to prevent an off-leakage current from generating, so that the pause refresh characteristics can be improved.

The voltage level of the non-selected word line may rise due to capacitive coupling at the time of word line selection or sensing operation. However, since the non-selected word line is at a negative voltage level, a forward bias state does not occur between the gate and source of the non-selected memory cell transistor. Thus, unaffected by such capacitive coupling, the non-selected memory cell can store data stably.

Still further, upon completion of the sensing operation, even if non-selected memory cell transistor MRN is connected to a bit line of an L level, its gate-source voltage is at a negative voltage level of a reverse bias state, and the off-leakage current is restricted sufficiently. Accordingly, the disturb refresh characteristics is improved.

In this case, in a selected memory cell, the gate-source voltage is at most at the sense power supply voltage VCCS level, and dielectric breakdown characteristics of its gate insulating film is sufficiently ensured. In the non-selected memory cell, the gate-source voltage Vu is at most BLL (V)–Vbb. Here, BLL (V) represents a voltage of bit line BLL when transmitting an H level data.

Thus, in this non-selected memory cell, the gate-source voltage of the transistor is decreased from VCCS–Vbb by the threshold voltage Vthn of the MOS transistor of the isolation gate. Thus, by adjusting this threshold voltage of MOS transistor NTG of the isolation gate, voltage Vu can be set so as not to exceed sense power supply voltage VCCS, and dielectric breakdown characteristics of the gate insulating film is ensured sufficiently.

In the MOS transistor of the isolation gate transmitting H level data, even if the voltage level of the bit line increases, the back gate is biased negatively with respect to the source. Thus, it is possible to increase the threshold voltage of the isolation gate transistor, and the condition of setting voltage Vu to a level not exceeding sense power supply voltage VCCS can readily be satisfied.

In particular, by forming isolation gates BIGLN and BIGRN outside the P well region for the memory block, it is possible to adjust the voltage level of well bias voltage VWV2 for adjusting the threshold voltage of MOS transistor NTG of the isolation gate, and thus, to set voltage Vu to a level not exceeding sense power supply voltage VCCS.

Accordingly, in the case where the negative voltage non-boosted word line driving scheme is applied with the use of N channel MOS transistors for both a memory cell and an isolation gate, it is still possible to sufficiently ensure the dielectric breakdown characteristics of the gate insulating film of the memory cell transistor. Therefore, a semiconductor memory device excellent in data retention characteristics is implemented without impairing reliability of the gate insulating film.

Figure 21:
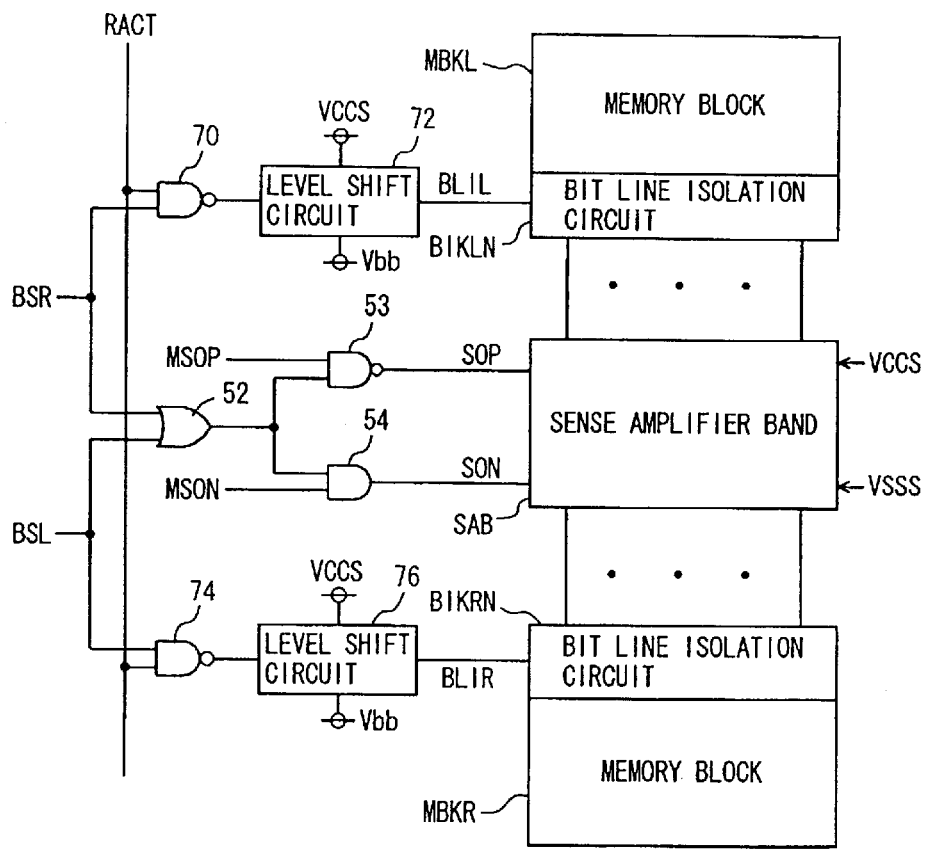
FIG. 21 schematically shows a configuration of a control signal generating portion of the semiconductor memory device according to the second embodiment.

FIG. 21 schematically shows a configuration of a portion generating control signals related to bit line isolation in the second embodiment of the present invention. Referring to FIG. 21, a bit line isolation circuit BIKLN is provided for memory block MBKL, and a bit line isolation circuit BIKRN is provided for memory block MBKR. Bit line isolation circuits BIKLN and BIKRN are each formed of N channel MOS transistors. In memory blocks MBKL and BMKR, memory cell transistors are also formed of N channel MOS transistors.

For bit line isolation circuit BIKLN, there are provided a NAND circuit 70 which receives an array activating signal RACT and a block select signal BSR, and a level shift circuit 72 which level-converts an output signal of NAND circuit 70 to generate a bit line isolation instructing signal BLIL. Level shift circuit 72 converts the signal of a peripheral power supply voltage level to a signal of an array power supply voltage (sense power supply voltage) VCCS level.

For sense amplifier band SAB, as in the configuration shown in FIG. 17 above, an OR circuit 52 which receives block select signals BSR and BSL, a NAND circuit 53 which receives a main sense amplifier activating signal MSOP and an output signal of OR circuit 52 to generate a sense amplifier activating signal SOP, and an AND circuit 54 which receives the output signal of OR circuit 52 and a main sense amplifier activating signal MSON to generate a sense amplifier activating signal SON are provided.

For bit line isolation circuit BIKRN, a NAND circuit 74 which receives block select signal BSL and array activating signal RACT, and a level shift circuit 76 which level-converts an output signal of NAND circuit 74 to generate a bit line isolation instructing signal BLIR are provided. Level shift circuit 76 converts the signal of an H level (peripheral power supply voltage level) output from NAND circuit 74 to a signal of an array power supply voltage VCCS level.

In the configuration shown in FIG. 21, block select signals BSR and BSL are generated in accordance with a block address signal, and attain an H level when memory block MBKR and MBKL are selected, respectively. When memory block MBKL is selected, block select signal BSL attains an H level, the output signal of NAND circuit 74 attains an L level, and bit line isolation instructing signal BLIR from level shift circuit 76 attains a ground voltage level. In response, bit line isolation circuit BIKRN is rendered non-conductive, and memory block MBKR is isolated from sense amplifier band SAB. Block select signal BSR maintains an L level, so that the output signal of NAND circuit 70 is at an H level, and bit line isolation instructing signal BLIL from level shift circuit 72 maintains the sense power supply voltage VCCS level. Accordingly, memory block MBKL and sense amplifier band SAB are continuously connected via bit line isolation circuit BIKLN.

In a stand-by state, array activating signal RACT is at an L level, and the output signals of NAND circuits 70 and 74 are both at an H level. Accordingly, bit line isolation instructing signals BLIL and BLIR are both at the sense power supply voltage VCCS level.

Figure 22:
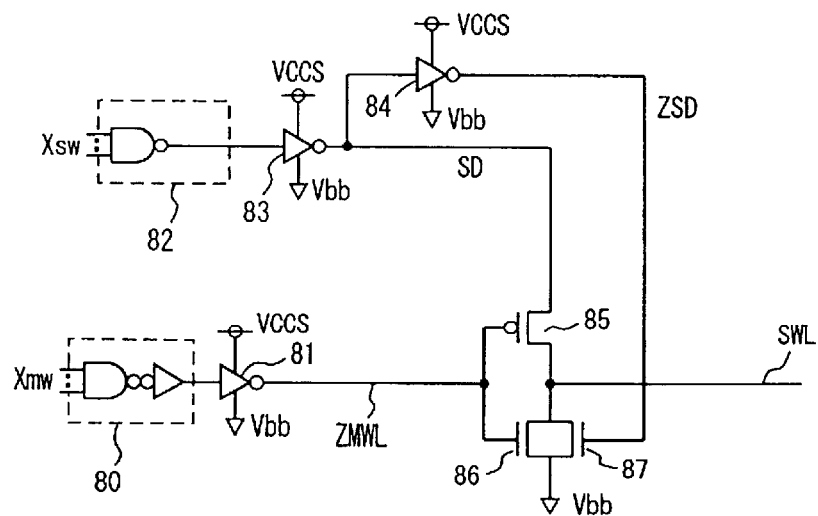
FIG. 22 shows an exemplary configuration of the selection portion in the semiconductor memory device according to the second embodiment.

FIG. 22 shows an exemplary configuration of a row select circuit in the semiconductor memory device according to the second embodiment of the present invention. In the second embodiment as well, the word line has the hierarchical word line configuration with main and sub word lines. For this hierarchical word line configuration, either the four-way hierarchical word line configuration with four sub-word lines disposed for one main word line or the eight-way hierarchical word line configuration with eight sub-word lines arranged for one main word line may be employed. Referring to FIG. 22, the row selection circuit includes: an AND type decode circuit 80 which decodes a main word line address signal Xmw; an inverter circuit 81 with a level conversion function which inverts and level-converts an output signal of AND type decode circuit 80; a NAND type decode circuit 82 which decodes a sub-word line address signal Xsw; an inverter circuit 83 with a level conversion function which inverts and level-converts an output signal of NAND type decode circuit 82; and an inverter circuit 84 which inverts an output signal of inverter circuit 83.

Inverter circuit 81 with the level conversion function converts the output signal of AND type decode circuit 80 to a signal changing between sense power supply voltage VCCS and negative voltage Vbb. This inverter circuit 81 drives the main word line ZMWL. AND type decode circuit 80 outputs a signal of an H level when main word line address signal Xmw is in a predetermined state, i.e., when main word line ZMWL is selected. Inverter circuit 81 with the level conversion function converts this signal of the H level generated from the decode circuit 80 to a signal of a negative voltage Vbb level, and transmits a resultant signal onto main word line ZMWL. Thus, main word line ZMWL is at a negative voltage Vbb level when selected.

In a non-selected state, the output signal of AND type decode circuit 80 is at an L level, and the output signal of inverter circuit 81 with the level conversion function is at a sense power supply voltage VCCS level. Main word line ZMWL is maintained at the sense power supply voltage VCCS level.

NAND type decode circuit 82 outputs a signal of an L level when sub-word line address signal Xsw is in a selected state. Inverter circuit 83 with the level conversion function inverts the output signal of NAND type decode circuit 82. Thus, a sub-decode signal SD outputted from this inverter circuit 83 with the level conversion function is at the sense power supply voltage VCCS level in the selected state, and at a negative voltage Vbb level when non-selected. Inverter circuit 84 simply inverts the output signal of this inverter circuit 83 with the level conversion function. Thus, a complementary sub-decode signal ZSD outputted from inverter circuit 84 is at an L level of the negative voltage level when selected, and at an H level of the sense power supply voltage level when non-selected.

This row selection circuit further includes: a P channel MOS transistor 85 which is selectively rendered conductive in response to the signal on main word line ZMWL and transmits sub-decode signal SD to sub-word line SWL when selected; an N channel MOS transistor 86 which is rendered conductive when the signal on main word line ZMWL is at an H level and transmits negative voltage Vbb to sub-word line SWL when conductive; and an N channel MOS transistor 87 which is selectively rendered conductive according to complementary sub-decode signal ZSD and transmits negative voltage Vbb to sub-word line SWL when rendered conductive.

MOS transistors 85–87 constitute a sub-word driver disposed corresponding to each respective sub-word line in the sub-word driver band.

When main word line ZMWL is at the negative voltage Vbb level of a selected state, MOS transistor 86 is rendered non-conductive. When sub-decode signal SD is at an H level (VCCS level), MOS transistor 85 is rendered conductive, and sub-decode signal SD is transmitted to sub-word line SWL. Thus, sub-word line SWL in the selected state is at the sense power supply voltage VCCS level. In this state, complementary sub-decode signal ZSD is at the negative voltage Vbb level, and MOS transistor 87 is in an off state.

When main word line MWL is at an L level of negative voltage level, if sub-decode signal SD is at the negative voltage Vbb level, MOS transistor 85 turns off state. In this state, complementary sub-decode signal ZSD is at an H level, and MOS transistor 87 is rendered conductive. Sub-word line SWL is maintained at the negative voltage Vbb level.

When main word line ZMWL is at an H level, MOS transistor 86 is rendered conductive, and sub-word line SWL maintains the negative voltage Vbb level regardless of the voltage level of sub-decode signal SD.

In the hierarchical word line configuration, a selected sub-word line SWL can be driven between sense power supply voltage VCCS and negative voltage Vbb, utilizing level converting circuits.

In the configuration described above, bit line isolation instructing signals BIL and BLIR have their L level set to the ground voltage level. These bit line isolation instructing signals BLIL and BLIR can readily be set to a negative voltage Vbb level by utilizing a negative voltage being supplied to a word line driver or a row selection circuit arranged in the vicinity thereof. Accordingly, when the bit line isolation gate is formed of N channel MOS transistors, the L level of these bit line isolation instructing signals BLIL and BLIR may be a negative voltage Vbb level, rather than the ground voltage level.

For transmission paths of well voltages, cell plate voltage and sense power supply voltage VCCS to memory block MBKL, bit line isolation circuit BIKLN, sense amplifier band SAB, bit line isolation circuit BIKRN and memory block MBKR, a configuration similar to that in FIG. 15 or 16 can be utilized. By inverting the polarities of the well bias voltages, well bias voltages PWV1 and PWV2 in the second embodiment can be obtained.

As described above, according to the second embodiment of the present invention, N channel MOS transistors are used for the memory cell transistors and the bit line isolation gates. When a selected word line is driven according to a negative voltage word line driving scheme, threshold voltage loss is generated in the bit line isolation gate. Thus, in a non-selected memory cell and a selected memory cell, dielectric breakdown characteristics of the memory transistors is ensured sufficiently without impairing data retention characteristics of the memory cell transistors. Accordingly, a highly reliable semiconductor memory device excellent in data retention characteristics is implemented.

Other Configurations

In the configurations described above, the active regions are placed aligned in row and column directions. However, even in a configuration where two bit lines are provided for active regions disposed in a line and the active regions disposed in a line are connected to these two bit lines alternately, data access in the twin cell mode can be made by selecting two word lines at a time, and the similar effects can be provided. Further, arrangement of the memory cells is not limited to the arrangement as described thus far. The present invention is applicable to any memory cell arrangement as long as it allows for complementary data to be regularly read onto bit lines in a pair.

As described above, according to the present invention, a memory block and a bit line isolation gate are formed in separate wells, and a word line is driven according to a negative voltage non-boosted word line driving scheme. Further, to the bit line isolation gate in a conductive state, a voltage level corresponding to one of operating power supply voltages of a sense amplifier is provided as a control signal. Thus, the voltage applied across gate insulating films of transistors of selected memory cell and non-selected memory cell can be alleviated utilizing threshold voltage loss of the bit line isolation gate. Accordingly, a semiconductor memory device exhibiting excellent data retention characteristics and having highly reliable gate insulating film is realized.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
    a plurality of memory sub-blocks each having a plurality of memory cells arranged in rows and columns, each memory sub-block including a plurality of word lines, arranged corresponding to the respective rows, each connecting to the memory cells in a corresponding row, and a plurality of bit lines, arranged corresponding to the respective columns, each connecting to the memory cells in a corresponding column;
    a plurality of sense amplifier bands arranged corresponding to said plurality of memory sub-blocks and shared between adjacent memory sub-blocks, each sense amplifier band including a plurality of sense amplifiers, arranged corresponding to the columns of a corresponding memory sub-block, for sensing and amplifying memory cell data in corresponding columns when activated, said each sense amplifier receiving a first power supply voltage and a second power supply voltage different in logical level from said first power supply voltage as operating power supply voltages and performing a sensing operation when activated;
    a plurality of bit line isolation circuits arranged corresponding to the sense amplifier bands, each bit line isolation circuit having a plurality of isolation gates, arranged corresponding to the columns in a corresponding memory sub-block, for connecting the sense amplifiers of corresponding columns to corresponding bit lines in the corresponding memory sub-block when made conductive, each of said plurality of bit line isolation circuits including the plurality of isolation gates formed in a well region different from a well region for forming the corresponding memory sub-block, each isolation gate being formed of an insulated gate type field effect transistor;

bit line isolation control circuitry for generating an isolation control signal of the first power supply voltage level to a bit line isolation circuit arranged for a selected memory sub-block including a selected memory cell addressed in accordance with a first address signal, and generating a non-selected isolation control signal of a voltage level having an absolute value not smaller than an absolute value of said second power supply voltage to a non-selected bit line isolation circuit provided for a memory sub-block sharing the sense amplifier band with said selected memory sub-block; and word line selection circuitry for driving a selected word line provided corresponding to a row addressed in said selected memory sub-block according to a second address signal to said first power supply voltage level, and transmitting a voltage greater in absolute value than the second power supply voltage to the word lines other than said selected word line.

2. The semiconductor memory device according to claim 1, wherein said plurality of memory cells are so arranged as to constitute twin cell units each for storing one bit data by the memory cell of two bits, the bit lines are arranged in pairs, and said word line selection circuitry selects a word line such that data of the memory cells of two bits of a twin cell unit are read out to the respective bit lines of a corresponding bit line pair.

3. The semiconductor memory device according to claim 1, wherein the memory cell includes an access transistor formed of a P channel transistor and selectively rendered conductive in response to a signal on a corresponding word line, said first power supply voltage is a high level power supply voltage and said second power supply voltage is a low level power supply voltage, and said word line selection circuitry transmits said low level power supply voltage to the selected word line and transmits a voltage higher than said high level power supply voltage to non-selected word lines other than said selected word line.

4. The semiconductor memory device according to claim 3, wherein the isolation gate is formed of a P channel transistor, and said bit line isolation control circuitry transmits the isolation control signal of said low level power supply voltage level to a bit line isolation gate arranged corresponding to said selected memory sub-block, and transmits the non-selected isolation control signal of a voltage level not lower than said first power supply voltage to the non-selected bit line isolation circuit.

5. The semiconductor memory device according to claim 1, wherein the memory cell includes an access transistor formed of an N channel transistor and selectively rendered conductive in response to a signal on a corresponding word line, said first power supply voltage is a lower level power supply voltage and said second power supply voltage is a high level power supply voltage, and said word line selection circuitry transmits said high level power supply voltage to the selected word line corresponding to the addressed row, and transmits a non-selected voltage lower than said low level power supply voltage to non-selected word lines other than said select word line.

6. The semiconductor memory device according to claim 5, wherein said isolation gate is formed of an N channel transistor, and said isolation control circuitry transmits the isolation control signal of said high level power supply voltage level to the bit line isolation circuit arranged corresponding to the selected memory sub-block, and transmits the non-selected isolation control signal of a voltage level not higher than said first power supply voltage to the non-selected bit line isolation circuit.

7. The semiconductor memory device according to claim 1, wherein said semiconductor memory device is formed on a same semiconductor substrate as a logic performing a predetermined logical operation, and the memory cell includes a memory transistor having a gate insulating film the same in film thickness as an insulated gate type field effect transistor of a component of said logic, and a capacitor for storing data having a capacitor insulating film the same in composition as the gate insulating film of said memory transistor.

8. The semiconductor memory device according to claim 7, wherein said memory transistor has a gate electrode formed in a common electrode interconnection layer with an electrode of said capacitor.

9. The semiconductor memory device according to claim 1, further comprising:

a first well bias circuit for applying a first bias voltage to the well region for forming the memory sub-block and arranging the memory cells; and a second well bias circuit for applying a second bias voltage to the well region for forming the isolation gates.

10. The semiconductor memory device according to claim 1, wherein the memory cells are formed in rectangular-shaped active regions such that the memory cells of two bits aligned in a column direction are formed in each respective rectangular-shaped active regions, the active regions are disposed aligned in row and column directions, the memory cells of two bits adjacent to each other in the row direction constitute a twin cell unit storing data of one bit, and said word line selection circuitry selects a word line in the selected memory sub-block to transmit information stored in the two memory cells in the twin cell unit to adjacent bit lines, respectively.

11. The semiconductor memory device according to claim 1, wherein said voltage greater in absolute value than the second power supply voltage transmitted by said word line selection circuitry is at a same voltage level as the non-selected isolation control signal.

* * * * *